(12) United States Patent
Hong et al.

(10) Patent No.: US 11,494,021 B2
(45) Date of Patent: Nov. 8, 2022

(54) TOUCH DISPLAY DEVICE

(71) Applicant: LG DISPLAY CO., LTD., Seoul (KR)

(72) Inventors: YoungJun Hong, Paju-si (KR);
BooYoung Kim, Paju-si (KR);
SeongHoon Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/411,677

(22) Filed: Aug. 25, 2021

(65) Prior Publication Data

US 2022/0164048 A1    May 26, 2022

(30) Foreign Application Priority Data

Nov. 20, 2020   (KR) .................. 10-2020-0156642

(51) Int. Cl.
*G06F 3/041*   (2006.01)
*G06F 3/044*   (2006.01)

(52) U.S. Cl.
CPC .......... *G06F 3/0412* (2013.01); *G06F 3/0446* (2019.05)

(58) Field of Classification Search
CPC .. G06F 2203/04111; G06F 2203/04112; G06F 3/0412; G06F 3/04164; G06F 3/0443
See application file for complete search history.

(56) References Cited

U.S. PATENT DOCUMENTS

| 10,921,936 | B2 * | 2/2021 | Kim .................. G06F 3/0445 |
| 11,301,100 | B2 * | 4/2022 | Won .................. G06F 3/044 |
| 2013/0314625 | A1 | 11/2013 | Tsai et al. |
| 2016/0124556 | A1 * | 5/2016 | Choi .................. G06F 3/04164 345/173 |
| 2017/0119177 | A1 * | 5/2017 | Frank .................. A47F 3/005 |
| 2017/0170242 | A1 | 6/2017 | Choi et al. |
| 2018/0061899 | A1 | 3/2018 | Oh et al. |
| 2018/0188614 | A1 | 7/2018 | Yeh |
| 2018/0190723 | A1 | 7/2018 | Han et al. |
| 2019/0179466 | A1 | 6/2019 | Kim et al. |

(Continued)

FOREIGN PATENT DOCUMENTS

| CN | 108255355 A | 7/2018 |
| CN | 110045851 A | 7/2019 |

(Continued)

OTHER PUBLICATIONS

Office Action dated May 30, 2022, issued in corresponding Taiwanese Patent Application No. 110134377.

*Primary Examiner* — Robin J Mishler
(74) *Attorney, Agent, or Firm* — Morgan, Lewis & Bockius LLP

(57) ABSTRACT

Embodiments of the disclosure relate to touch display devices. Display pads and touch pads may be arranged on the same side of a display panel by removing a portion of a second substrate to thereby expose the touch pads to the outside after attaching the second substrate on which the touch pads are arranged to a first substrate on which the display pads are arranged.
Since the touch pads are positioned higher than the display pads in the area that does not overlap the display pads, bonding between the pads and the printed circuit may be easy to perform. Since the number of pads that may be arranged increases, it is possible to easily implement a large-area, high resolution touch display device.

20 Claims, 25 Drawing Sheets

(56) References Cited

U.S. PATENT DOCUMENTS

| | | |
|---|---|---|
| 2019/0187852 A1 | 6/2019 | Jin et al. |
| 2020/0026408 A1 | 1/2020 | Lee et al. |
| 2021/0119177 A1* | 4/2021 | Bang .................... H01L 51/5253 |
| 2021/0357060 A1* | 11/2021 | Kim .................... H01L 51/5253 |

FOREIGN PATENT DOCUMENTS

| | | |
|---|---|---|
| TW | 201348803 A | 12/2013 |
| TW | I656463 B | 4/2019 |

* cited by examiner

FIG.16
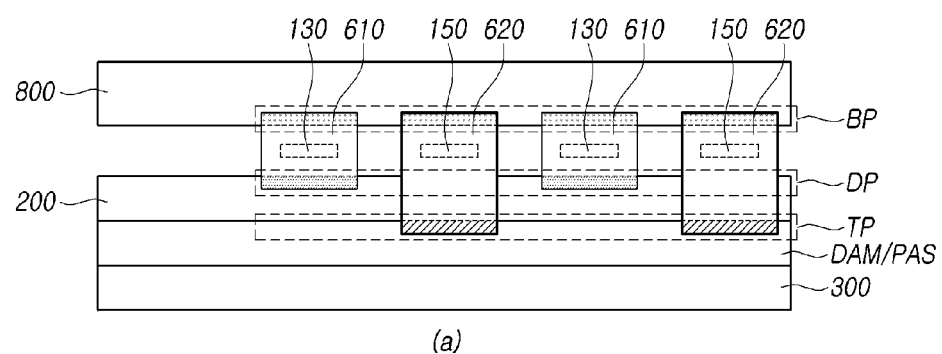
(a)
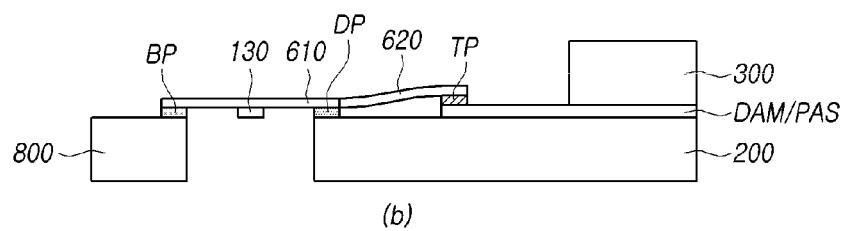
(b)

FIG.19
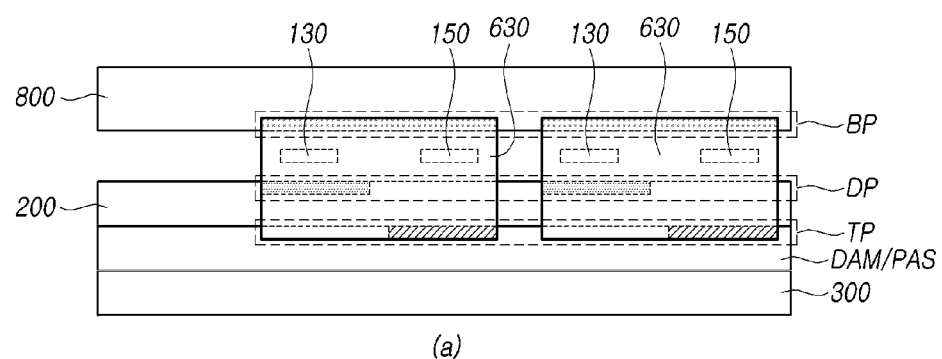
(a)
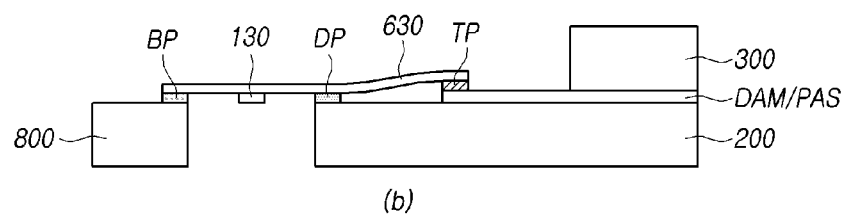
(b)

FIG.20
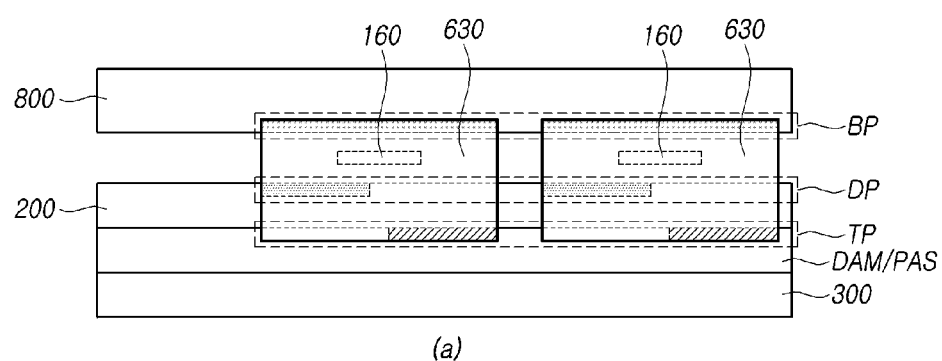
(a)
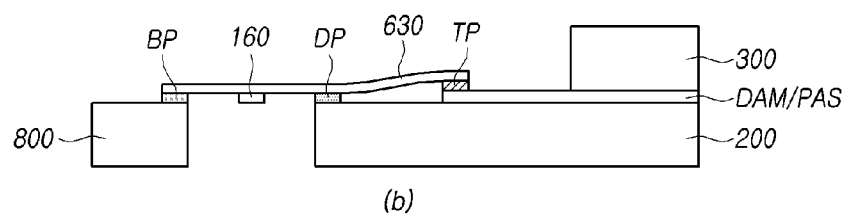
(b)

FIG.21
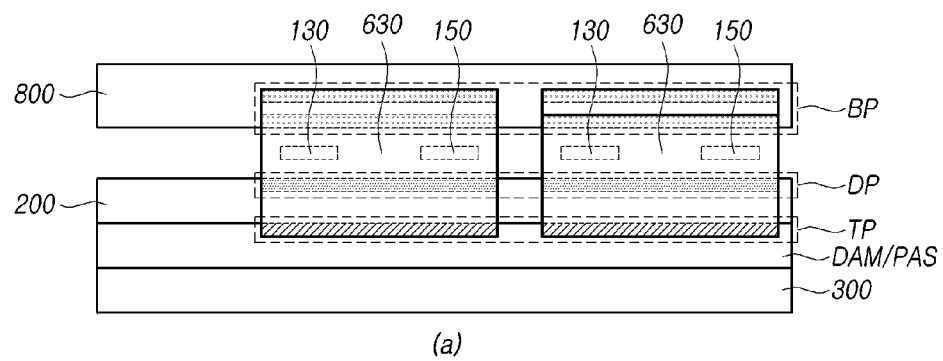
(a)
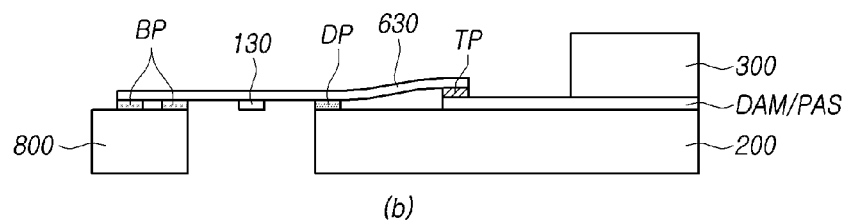
(b)

FIG.22
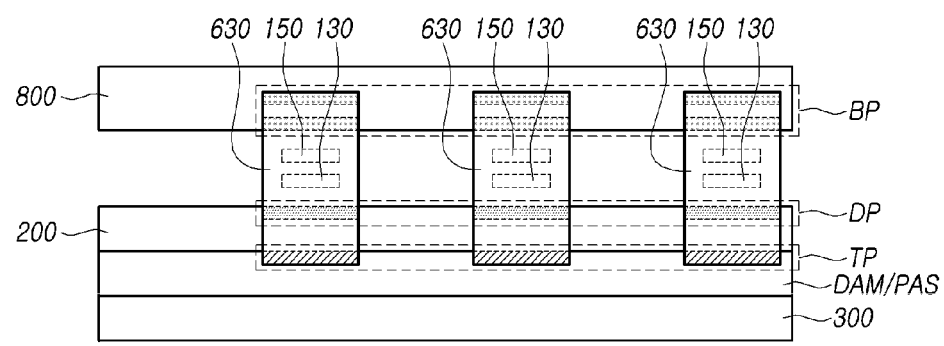
(a)
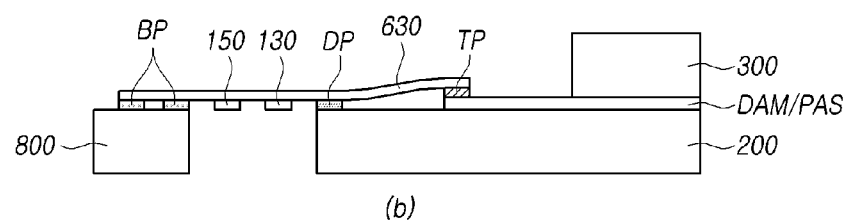
(b)

FIG.23
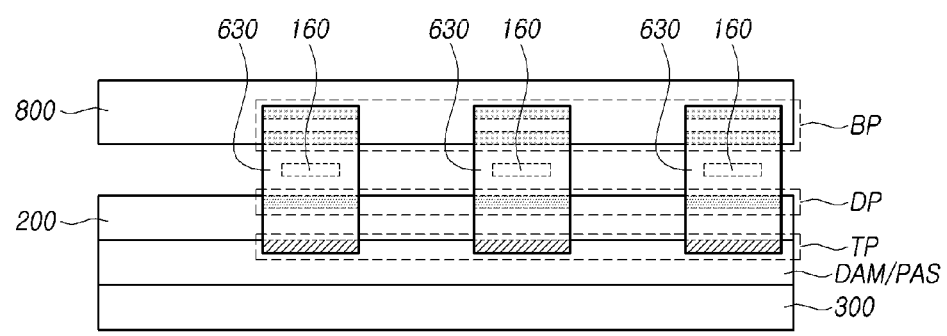
(a)
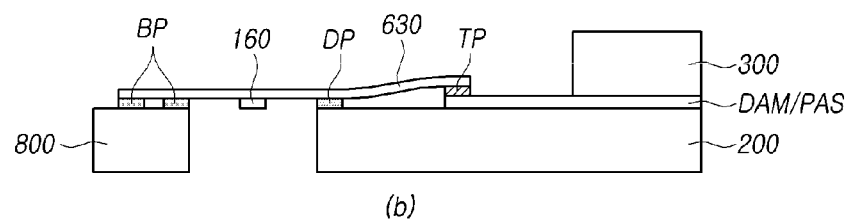
(b)

FIG.24
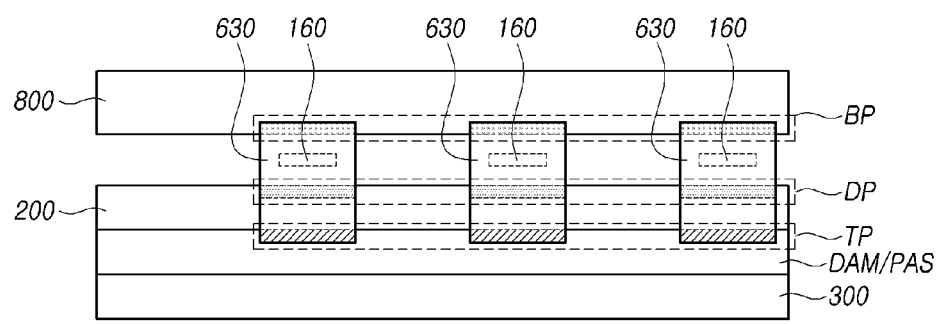
(a)
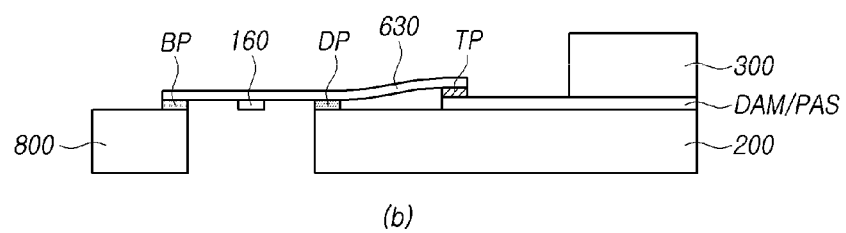
(b)

TOUCH DISPLAY DEVICE

CROSS-REFERENCE TO RELATED APPLICATION

This application claims priority from Korean Patent Application No. 10-2020-0156642, filed on Nov. 20, 2020, which is hereby incorporated by reference for all purposes as if fully set forth herein.

BACKGROUND

Technical Field

Embodiments of the disclosure relate to touch display devices.

Discussion of the Related Art

The growth of the intelligent society leads to increased demand for image display devices and use of various types of display devices, such as liquid crystal displays, organic light emitting displays, etc.

The display device recognizes a touch on the display panel, by the user's finger or a pen, and performs input processing based on the recognized touch so as to provide more various functions to the user.

A display device capable of recognizing the user's touch may include a plurality of touch electrodes embedded in the display panel or disposed on the display panel. The display device may recognize the user's touch by supplying a touch driving signal to a plurality of touch electrodes disposed on the display panel and detecting a touch sensing signal from the plurality of touch electrodes.

To drive the plurality of touch electrodes disposed on the display panel, a plurality of touch pads need to be disposed on the display panel.

Since the display panel needs to have multiple display pads for driving the display arranged thereon, it is difficult to place multiple touch pads. It may also be hard to reduce the bezel area of the display panel due to the arrangement of multiple touch pads.

Therefore, a need exists for a method for efficiently arranging multiple touch pads on the display panel while avoiding an increase in the bezel area of the display panel.

SUMMARY

Accordingly, embodiments of the present disclosure are directed to a touch display device that substantially obviates one or more of the problems due to limitations and disadvantages of the related art.

An aspect of the present disclosure is to provide a method for arranging a plurality of touch pads and a plurality of display pads on a display panel while avoiding an increase in the thickness or bezel area of the display panel.

Another aspect of the present disclosure is to provide a method for implementing a large-area display device capable of touch recognition by increasing the number of touch pads that may be arranged in a predetermined area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a touch display device comprises a first substrate including an active area and a non-active area positioned outside the active area, a plurality of first pads arranged in the non-active area on the first substrate, at least one dam positioned between the plurality of first pads and the active area on the first substrate, a second substrate positioned on the at least one dam and the first substrate and positioned in an area except for at least a partial area of an area overlapping the at least one dam, a plurality of touch electrodes disposed on a surface of the second substrate, and a plurality of second pads positioned on the at least one dam and electrically connected with at least one touch electrode among the plurality of touch electrodes.

The plurality of second pads may be positioned in an area except for an area overlapping the second substrate.

An upper surface of the plurality of second pads may be positioned lower than a lower surface of the second substrate.

The at least one dam may include a first dam positioned outside the active area and a second dam positioned outside the first dam and disposed under the plurality of second pads.

The touch display device may further comprise a sacrificial layer disposed in a partial area on a lower surface of the second substrate. The sacrificial layer may be positioned between the active area and the plurality of second pads.

In another aspect, a touch display device comprises a first substrate including an active area and a non-active area positioned outside the active area, a plurality of first pads arranged in the non-active area on the first substrate, a plurality of second pads positioned between the plurality of first pads and the active area on the first substrate and positioned higher than the plurality of first pads, and a second substrate positioned in an area except for an area where the plurality of second pads are arranged on the first substrate and positioned higher than the plurality of second pads, a plurality of touch electrodes disposed on a surface of the second substrate.

In another aspect, a touch display device comprises a display substrate including an active area and a non-active area positioned outside the active area, a touch substrate positioned on the display substrate, a plurality of touch electrodes disposed on a surface of the touch substrate, and an insulating layer including a first portion disposed in at least a partial area of a lower surface of the touch substrate and a second portion connected with the first portion, positioned outside the touch substrate, and having a recessed area where a plurality of touch pads are positioned.

According to the embodiments, there is provided a structure in which a plurality of display pads and a plurality of touch pads both may be disposed on any one of the side portions of the display panel. Therefore, it is possible to easily arrange a plurality of pads on the display panel while preventing an increase in the bezel area of the display panel.

According to the embodiments, it is possible to increase the number of touch pads that may be arranged on the display panel and easily implement the touch recognition function of a large-area display device by a structure in which a plurality of touch pads are positioned between display pads and the active area.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIGS. 16, 17, 18, 19, 20, 21, 22, 23, and 24 are views illustrating an example connection structure between a driving circuit and a plurality of pads arranged in a touch display device according to an embodiment.

DETAILED DESCRIPTION

Figure 1:
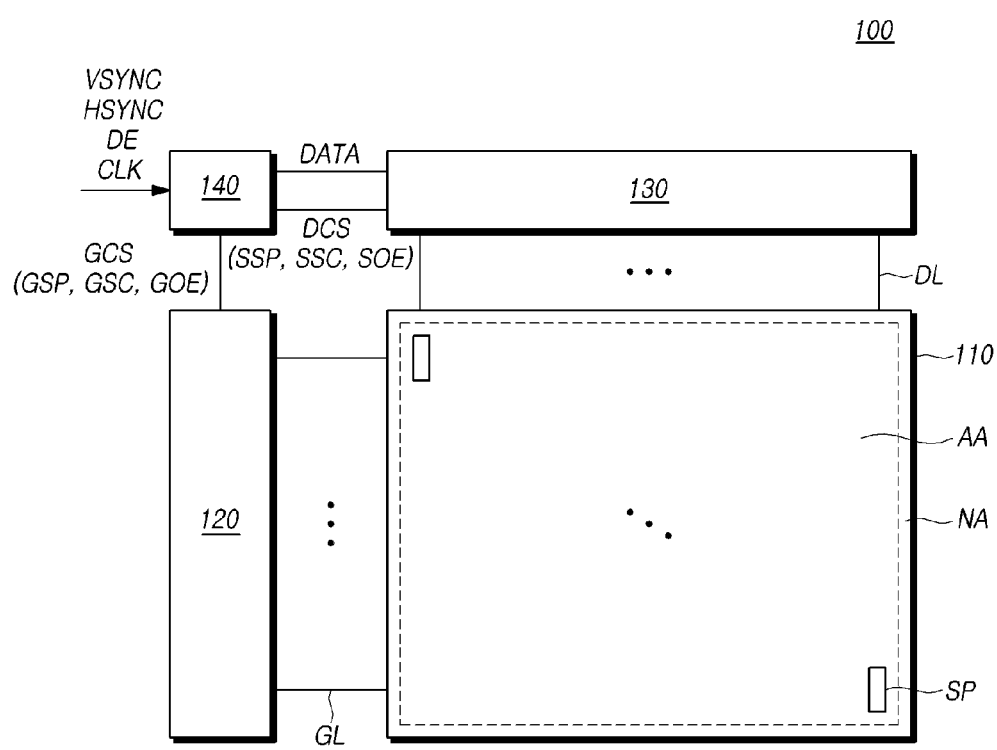
FIG. 1 is a view schematically illustrating a configuration of a touch display device according to an embodiment.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a view schematically illustrating a configuration of a touch display device 100 according to an embodiment.

Referring to FIG. 1, according to an embodiment, a touch display device 100 may include a display panel 110 including an active area AA in which a plurality of subpixels SP are disposed and a non-active area NA positioned outside the active area AA and in which signal lines or driving circuits are disposed. The touch display device 100 may include a gate driving circuit 120, a data driving circuit 130, and a controller 140 to drive the display panel 110.

The touch display device 100 may further include a touch driving circuit 150 to be described below with reference to FIGS. 2 and 3. Among the components included in the touch display device 100, components for display driving are briefly described, and components for touch sensing are then described below.

A plurality of gate lines GL and a plurality of data lines DL may be disposed on the display panel 110. The display panel 110 may include voltage lines for supplying various signals or voltages in addition to the gate lines GL and the data lines DL.

The subpixels SP may be located where the gate lines GL and the data lines DL cross each other. The subpixel SP may include several circuit elements. Two or more subpixels SP may constitute one pixel.

The gate driving circuit 120 may be controlled by the controller 140. The gate driving circuit 120 sequentially outputs scan signals to a plurality of gate lines GL disposed on the display panel 110 and may control driving timings of the plurality of subpixels SP.

The gate driving circuit 120 may include one or more gate driver integrated circuits (GDIC).

The gate driving circuit 120 may be located only on one side of the display panel 110 or on each of two opposite sides according to driving methods. The gate driving circuit 120 may be implemented in the form of a gate in panel (GIP) disposed in the bezel area of the display panel 110.

The data driving circuit 130 may receive image data from the controller 140 and convert the received image data into an analog data voltage. The data driving circuit 130 may output a data voltage to each data line DL according to the timing at which a scan signal is applied through the gate line GL and may control each subpixel SP to represent a brightness according to the image data.

The data driving circuit 130 may include one or more source driver integrated circuits (SDICs).

The data driving circuit 130 may be located only on one side of the display panel 110 or on each of two opposite sides according to driving methods.

The controller 140 may supply various control signals to the gate driving circuit 120 and the data driving circuit 130 and control the operation of the gate driving circuit 120 and the data driving circuit 130.

The controller 140 controls the gate driving circuit 120 to output a scan signal according to a timing implemented in each frame. The controller 140 converts the image data received from the outside according to a data signal format used by the data driving circuit 130 and outputs the converted image data to the data driving circuit 130.

The controller 140 may receive, from the outside (e.g., a host system), various timing signals including a vertical synchronization signal VSYNC, a horizontal synchronization signal HSYNC, an input data enable signal DE, and a clock signal, along with the image data.

The controller 140 may generate a plurality of control signals using various timing signals received from the outside and output the generated control signals to the gate driving circuit 120 and the data driving circuit 130.

As an example, to control the gate driving circuit 120, the controller 140 may output various gate control signals GCS including a gate start pulse GSP, a gate shift clock GSC, and a gate output enable signal GOE.

The gate start pulse GSP controls the operation start timing of one or more gate driver integrated circuits GDICs constituting the gate driving circuit 120. The gate shift clock GSC is a clock signal commonly input to one or more gate driver integrated circuits GDICs and controls the shift timing of the scan signals. The gate output enable signal GOE designates timing information about one or more gate driver integrated circuits GDICs.

To control the data driving circuit 130, the controller 140 may output various data control signals DCS including, e.g., a source start pulse SSP, a source sampling clock SSC, and a source output enable signal SOE.

The source start pulse SSP controls the data sampling start timing of one or more source driver integrated circuits SDICs constituting the data driving circuit 130. The source sampling clock SSC is a clock signal for controlling the sampling timing of data in each source driver integrated circuit (SDIC). The source output enable signal SOE controls the output timing of the data driving circuit 130.

The touch display device 100 may further include a power management integrated circuit (not shown) that supplies various voltages or currents to, e.g., the display panel 110, the gate driving circuit 120, and the data driving circuit 130 or controls various voltages or currents to be supplied.

The touch display device 100 may include a configuration for touch sensing in addition to the configuration for display driving. The configuration for touch sensing may be separate from the configuration for display driving. In some cases, the configuration for display driving may be used for touch sensing, or the configuration for display driving and the configuration for touch sensing may be integrated together.

Figure 2:
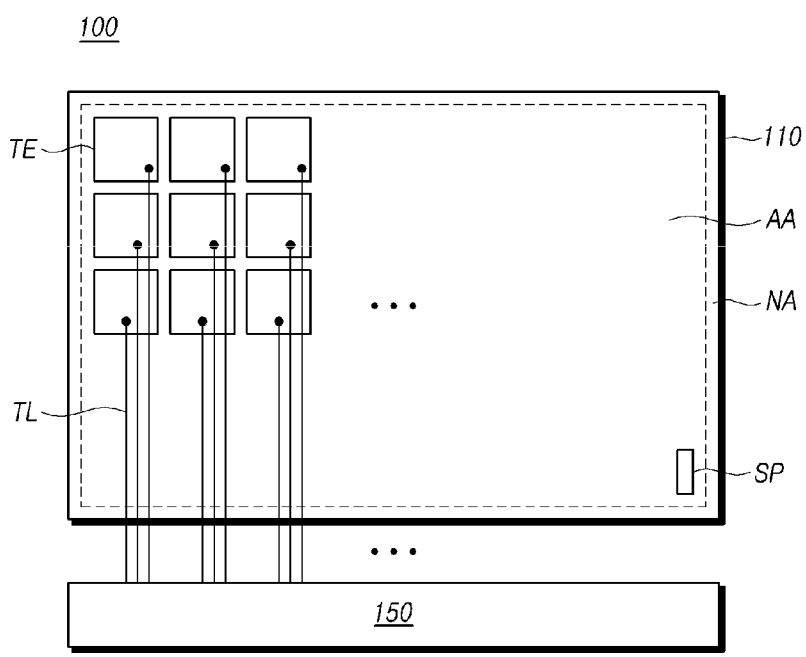
FIG. 2 is a view illustrating an example arrangement of touch electrodes included in a touch display device according to an embodiment.

FIG. 2 is a view illustrating an example arrangement of touch electrodes TE included in a touch display device 100 according to an embodiment.

Referring to FIG. 2, the touch display device 100 may include a plurality of touch electrodes TE, a plurality of touch lines TL, and a touch driving circuit 150.

The plurality of touch electrodes TE may be embedded in the display panel 110 or may be disposed on the display panel 110, for example. When the touch electrodes TE are embedded in the display panel 110, the touch electrodes TE may be electrodes disposed separately from the electrodes for display driving or may be electrodes for display driving.

The touch electrode TE may be, e.g., a transparent electrode.

Alternatively, the touch electrode TE may be an opaque electrode. When the touch electrode TE is an opaque electrode, the touch electrode TE may have a mesh shape including a plurality of openings. The openings of the touch electrode TE may be positioned to correspond to the light emitting area of the subpixel SP.

The plurality of touch lines TL may electrically connect the touch electrodes TE and the touch driving circuit 150.

Touch driving signals may be supplied to the touch electrodes TE through the touch lines TL. Touch sensing signals may be detected from the touch electrodes TE through the touch lines TL.

Similar to the data driving circuit 130, the touch driving circuit 150 may be disposed on a printed circuit (film) bonded to the non-active area NA of the display panel 110. The touch driving circuit 150 may be disposed separately from the data driving circuit 130. In some cases, the touch driving circuit 150 may be integrated with the data driving circuit 130.

The touch driving circuit 150 may supply touch driving signals or detect touch sensing signals through the touch lines TL.

The touch driving circuit 150 may drive the touch electrodes TE and transmit sensing data according to the detected touch sensing signals to a touch controller (not shown). The touch controller may determine the presence and coordinates of a touch based on the sensing data.

The arrangement structure of the touch electrodes TE illustrated in FIG. 2 is a structure that may perform touch sensing by detecting a variation in self-capacitance between the user's finger or pen and the touch electrode TE due to the user's touch on the display panel 110.

In some cases, the touch electrodes TE in the touch display device 100 may be arranged in a structure capable of performing touch sensing by detecting a variation in mutual-capacitance between touch electrodes TE due to the user's touch.

Figure 3:
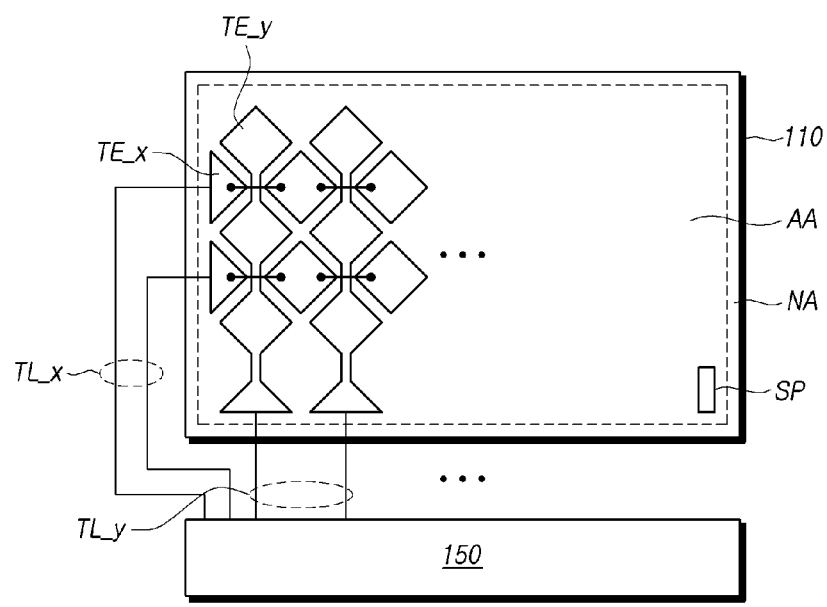
FIG. 3 is a view illustrating another example arrangement of touch electrodes included in a touch display device according to an embodiment.

FIG. 3 is a view illustrating another example arrangement of touch electrodes TE included in a touch display device 100 according to an embodiment.

Referring to FIG. 3, a plurality of X-touch electrodes TE_x may be arranged on the display panel 110. A plurality of Y-touch electrodes TE_y may be arranged on the display panel 110.

Among the plurality of X-touch electrodes TE_x, X-touch electrodes TE_x adjacent to each other in one direction may be connected with each other. Accordingly, among the plurality of X-touch electrodes TE_x, the X-touch electrodes TE_x positioned in the same row may be electrically connected with each other.

Among the plurality of Y-touch electrodes TE_y, Y-touch electrodes TE_y adjacent to each other in a direction crossing the direction in which the X-touch electrodes TE_x are connected may be connected with each other. Accordingly, among the plurality of Y-touch electrodes TE_y, the Y-touch electrodes TE_y positioned in the same column may be electrically connected with each other.

A portion connecting two adjacent X-touch electrodes TE_x and a portion connecting two adjacent Y-touch electrodes TE_y may cross each other. One of the portion connecting the X-touch electrodes TE_x and the portion connecting the Y-touch electrodes TE_y may be disposed on a layer different from the layer on which the touch electrodes TE are arranged.

A plurality of X-touch lines TL_x and a plurality of Y-touch lines TL_y may be arranged on the display panel 110.

The plurality of X-touch lines TL_x may be individually electrically connected with the plurality of X-touch electrodes TE_x electrically connected with each other. The plurality of Y-touch lines TL_y may be individually electrically connected with the plurality of Y-touch electrodes TE_y electrically connected with each other.

One of the X-touch electrode TE_x and the Y-touch electrode TE_y may function as a touch driving electrode, and the other may function as a touch sensing electrode. Accordingly, a signal applied to the X-touch electrode TE_x and a signal applied to the Y-touch electrode TE_y during a period of touch sensing may be different from each other.

For example, if the X-touch electrode TE_x is a touch driving electrode, the touch driving circuit 150 may supply a touch driving signal to the X-touch electrode TE_x through the X-touch line TL_x. The touch driving circuit 150 may detect a touch sensing signal from the Y-touch electrode TE_y functioning as the touch sensing electrode through the Y-touch line TL_y.

Alternatively, in some cases, a touch driving signal may be supplied to the Y-touch electrode TE_y, and a touch sensing signal may be detected from the X-touch electrode TE_x.

The touch driving circuit 150 may detect a variation in mutual-capacitance between the X-touch electrode TE_x and the Y-touch electrode TE_y due to the user's touch, with different signals applied to the X-touch electrode TE_x and the Y-touch electrode TE_y.

The touch controller may sense the user's touch on the display panel 110 based on the variation in mutual capacitance detected by the touch driving circuit 150.

As such, embodiments of the disclosure may drive the touch electrodes TE and the touch lines TL arranged on the display panel 110 and sense the user's touch to the display panel 110.

A plurality of touch pads TP may be disposed on the display panel 110 for electrical connection between the touch lines TL and the touch driving circuit 150. Since a plurality of display pads DP for display driving are also disposed on the display panel 110, it may not be easy to place a plurality of touch pads TP.

Embodiments of the disclosure provide a method for efficiently arranging a plurality of touch pads TP which are provided as the touch display device 100 includes a touch sensing function.

Figure 4:
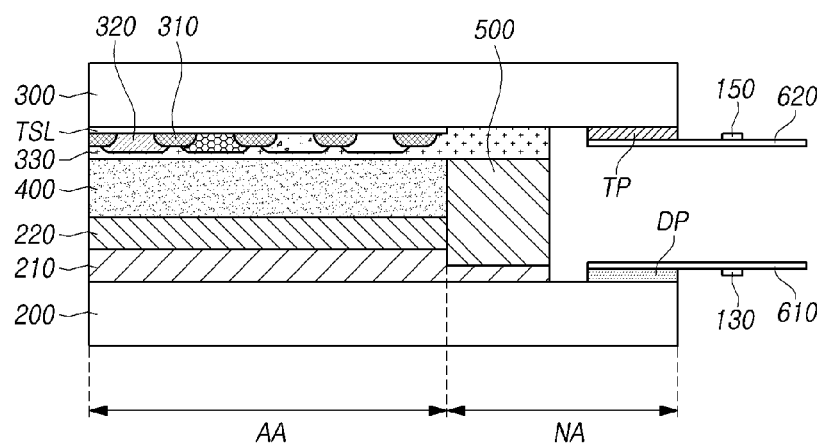
FIG. 4 is a view illustrating an example arrangement of display pads and touch pads in a touch display device according to an embodiment.

FIG. 4 is a view illustrating an example arrangement of display pads DP and touch pads TP in a touch display device 100 according to an embodiment.

Referring to FIG. 4, the touch display device 100 may include a first substrate 200 and a second substrate 300.

The first substrate 200 may be formed of, e.g., a transparent material, such as glass. Various circuit devices for display driving or light emitting elements may be disposed on the first substrate 200. In the disclosure, the first substrate 200 may be referred to as a "display substrate".

The second substrate 300 may be formed of, e.g., a transparent material, such as glass. Color filters may be disposed on the second substrate 300. A touch sensing layer TSL including the touch electrode TE and the touch line TL may be disposed on one surface of the second substrate 300. In the disclosure, the second substrate 300 may be referred to as a "touch substrate".

A thin film transistor layer 210 and a light emitting element layer 220 may be disposed on the first substrate 200.

Circuit elements, such as the thin film transistor or a capacitor included in the subpixel SP or driving circuit, or various signal lines may be disposed on the thin film transistor layer 210.

Each subpixel SP is disposed on the light emitting element layer 220, and a light emitting element representing a brightness depending on the data voltage supplied may be disposed on the light emitting element layer 220.

Although in the embodiments of the disclosure, the touch display device 100 is an organic light emitting display device as an example, the pad structure according to an embodiment may also be applied to other display devices, e.g., liquid crystal display (LCD) devices, than the organic light emitting display device.

At least one dam 500 may be disposed outside the light emitting element layer 220.

The active area AA of the display panel 110 may be defined by the dam 500. In some cases, the dam 500 may be disposed in a position slightly away from the outer periphery of the active area AA.

A filling layer 400 may be disposed on the light emitting element layer 220 surrounded by the dam 500.

The second substrate 300 may be disposed on the filling layer 400 and the dam 500.

A color filter or a touch sensing layer TSL may be disposed on the upper or lower surface of the second substrate 300.

For example, a black matrix 310 may be disposed on the lower surface of the second substrate 300. A color filter layer 320 may be disposed on the lower surface of the second substrate 300. An overcoat layer 330 may be disposed on the black matrix 310 and the color filter layer 320. The overcoat layer 330 may provide a planarization function.

The touch sensing layer TSL may be positioned on or under the color filter.

The second substrate 300 having the color filter and the touch sensing layer TSL is placed on the first substrate 200 after the circuit element for display driving and the light emitting element are disposed on the first substrate 200, so that it is possible to easily implement the touch display device 100 providing a touch sensing function.

A pad for electrical connection to the driving circuit may be disposed in a periphery area of the touch display device 100.

For example, a plurality of display pads DP may be disposed in the non-active area NA of the first substrate 200. In the disclosure, the display pad DP may be referred to as a "first pad".

The display pad DP may be, e.g., a data pad electrically connected with the data driving circuit 130. The display pad DP may be bonded to a first printed circuit 610 on which the data driving circuit 130 is mounted, and may be electrically connected with the data driving circuit 130.

A plurality of touch pads TP may be disposed in the non-active area NA of the second substrate 300. In the disclosure, the touch pad TP may be referred to as a "second pad".

The touch pad TP may be electrically connected with the touch sensing layer TSL disposed on the lower surface of the second substrate 300. The touch pad TP may be electrically connected with the touch driving circuit 150 mounted on the second printed circuit 620.

The display pad DP and the touch pad TP may be positioned on the same side of the display panel 110 as illustrated in FIG. 4. Accordingly, it is possible to prevent an increase in the non-active area NA of the display panel 110 due to an increase in the number of pads disposed on the display panel 110.

However, if the thickness of the display panel 110 decreases, the distance between the first substrate 200 and the second substrate 300 may be very short. Therefore, it may be difficult for the display pad DP and the touch pad TP to be disposed on the same side of the display panel 110.

In this case, the touch pad TP may be disposed on the upper surface of the second substrate 300 or may be disposed in a different area from the area where the display pad DP is located.

Figure 5:
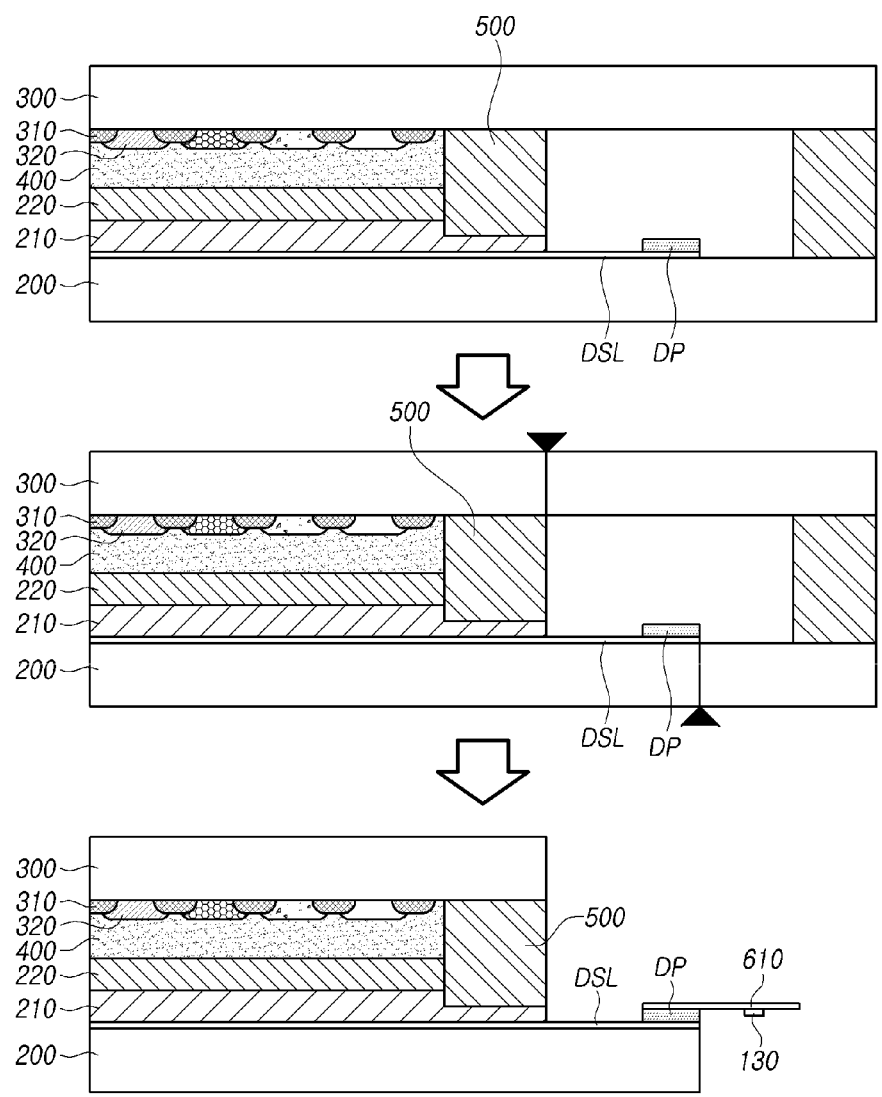
FIG. 5 is a view illustrating an example process for a touch display device according to an embodiment.

FIG. 5 is a view illustrating an example process for a touch display device 100 according to an embodiment.

FIG. 5 illustrates an example process for a touch display device 100 when the touch pad TP is disposed in an area different from the area in which the display pad DP is disposed.

In the example illustrated in FIG. 5, since the touch sensing layer TSL may be disposed on the upper surface or the lower surface of the second substrate 300, the touch sensing layer TSL is not shown for convenience.

A thin film transistor layer 210 and a light emitting element layer 220 may be disposed on the first substrate 200.

The display pad DP may be disposed in the non-active area NA of the first substrate 200. The display pad DP may be electrically connected with the display signal line DSL, and may be electrically connected with a signal line or circuit element in the active area AA through the display signal line DSL.

The filling layer 400 and the dam 500 may be disposed on the first substrate 200, and the second substrate 300 on which the color filter and the touch sensing layer TSL are formed may be disposed on the first substrate 200.

The touch pad TP may be disposed in the non-active area NA of the second substrate 300. The touch pad TP may be located in an area of the non-active area NA that does not overlap the area in which the display pad DP is disposed so as not to overlap the display pad DP. Accordingly, among the side portions of the display panel 110, the side portion on which the display pad DP is disposed and the side portion on which the touch pad TP is disposed may be different from each other.

After the second substrate 300 is disposed, the first substrate 200 and the second substrate 300 may be cut, and the first printed circuit 610 on which the data driving circuit 130 is mounted and the display pad DP may be bonded.

In this case, the touch pad TP is located in a different area from the display pad DP and may be electrically connected with the touch driving circuit 150.

Therefore, since the second substrate 300 on which the touch sensing layer TSL is formed may have the touch pad TP disposed thereon, but the area in which the display pad DP is disposed differs from the area in which the touch pad TP is disposed, the non-active area NA of the display panel 110 may increase.

According to an embodiment, there is provided a method for placing the touch pad TP on the side portion where the display pad DP is disposed among the side portions of the display panel 110 in the structure in which the touch sensing layer TSL and the touch pad TP are formed on the second substrate 300.

Figure 6:
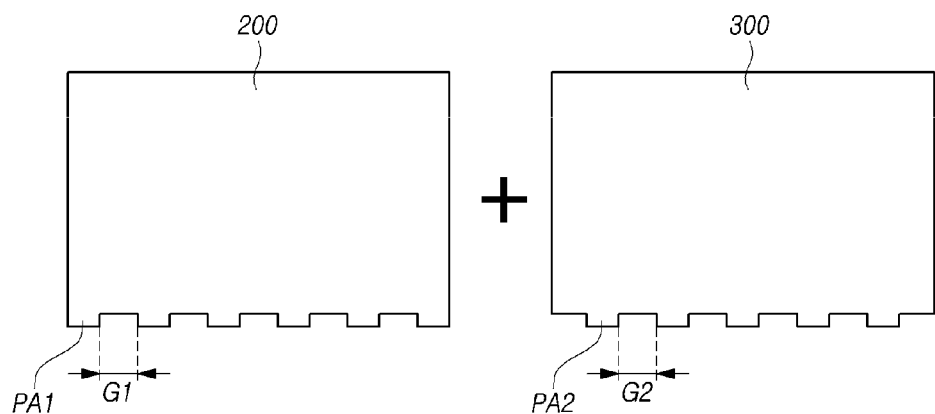
FIGS. 6 and 7 are views illustrating another example arrangement of display pads and touch pads in a touch display device according to an embodiment.
Figure 7:
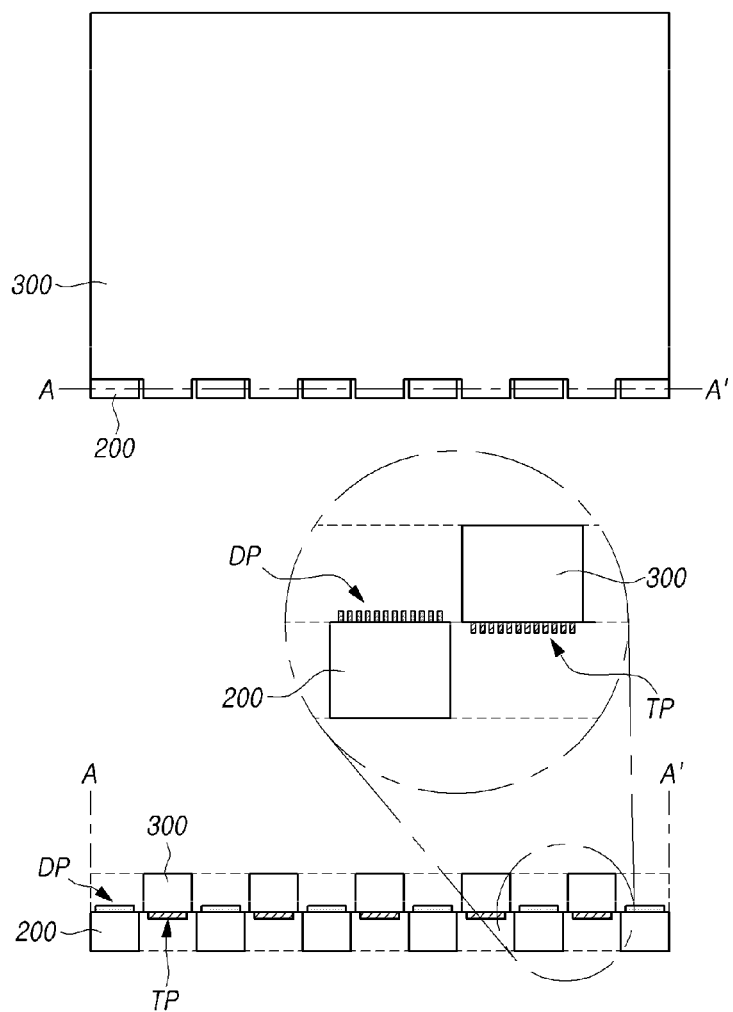

FIGS. 6 and 7 are views illustrating another example arrangement of display pads DP and touch pads TP in a touch display device 100 according to an embodiment.

Referring to FIG. 6, the first substrate 200 may include at least one first groove G1 positioned in the non-active area NA of the display panel 110. The second substrate 300 may include at least one second groove G2 positioned in the non-active area NA of the display panel 110.

An area adjacent to the first groove G1 in the non-active area NA of the first substrate 200 may be a first pad area PA1 in which the display pad DP is disposed.

An area adjacent to the second groove G2 in the non-active area NA of the second substrate 300 may be a second pad area PA2 in which the touch pad TP is disposed.

The first and second grooves G1 and G2 may be alternately positioned when the first and second substrates 200 and 300 overlap each other.

Accordingly, the first pad area PA1 and the second pad area PA2 may be alternately positioned when the first substrate 200 and the second substrate 300 overlap each other.

When the first substrate 200 and the second substrate 300 are attached together, the first pad area PA1 of the first substrate 200 may overlap the second groove G2 of the second substrate 300. The first groove G1 of the first substrate 200 may overlap the second pad area PA2 of the second substrate 300.

Since the second substrate 300 is not located on the first pad area PA1, bonding between the display pad DP and the first printed circuit 610 on which the data driving circuit 130 is mounted may be easily performed.

Further, since the first substrate 200 is not located on the second pad area PA2, bonding between the touch pad TP and the second printed circuit 620 on which the touch driving circuit 150 is mounted may be easily performed.

FIG. 7 illustrates a plan view and a cross-sectional view of the first substrate 200 and the second substrate 300 attached together.

In the structure in which the first substrate 200 and the second substrate 300 are attached together, the second substrate 300 may not be disposed on the display pads DP disposed on the first substrate 200. The first substrate 200 may not be disposed on the touch pads TP disposed on the second substrate 300.

By the structure in which the substrate facing the display pads DP or the touch pads TP is not located on the display pads DP or the touch pads TP, the display pads DP and the touch pads TP may be arranged on the same side portion among the side portions of the display panel 110.

According to an embodiment, it is thus possible to arrange the display pads DP and the touch pads TP in the non-active area NA to facilitate bonding while preventing an increase in the non-active area NA of the display panel 110.

According to an embodiment, there is provided a method for arranging display pads DP and touch pads TP on the same side portion among the side portions of the display panel 110 without forming a plurality of grooves in the first substrate 200 and the second substrate 300.

Figure 8:
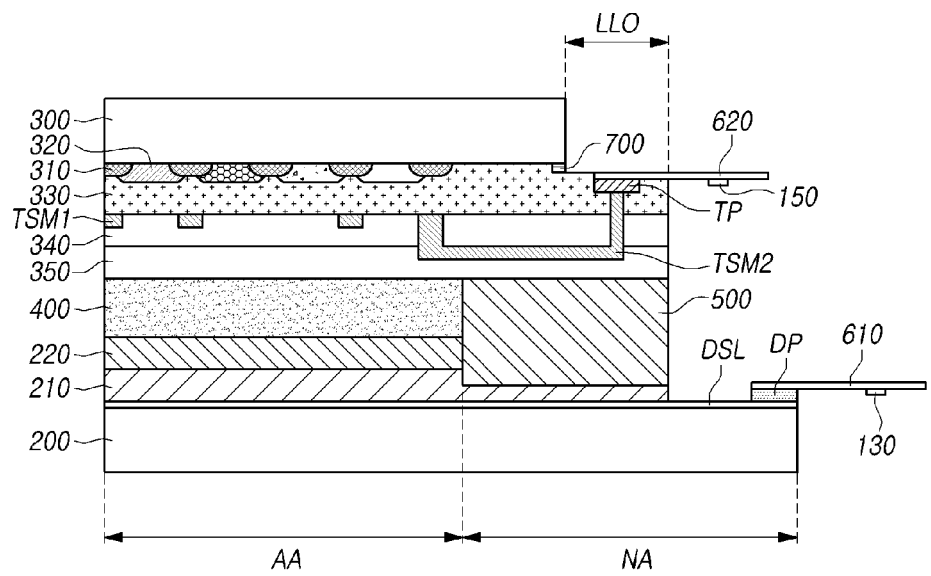
FIG. 8 is a view illustrating another example arrangement of display pads and touch pads in a touch display device according to an embodiment.
Figure 9:
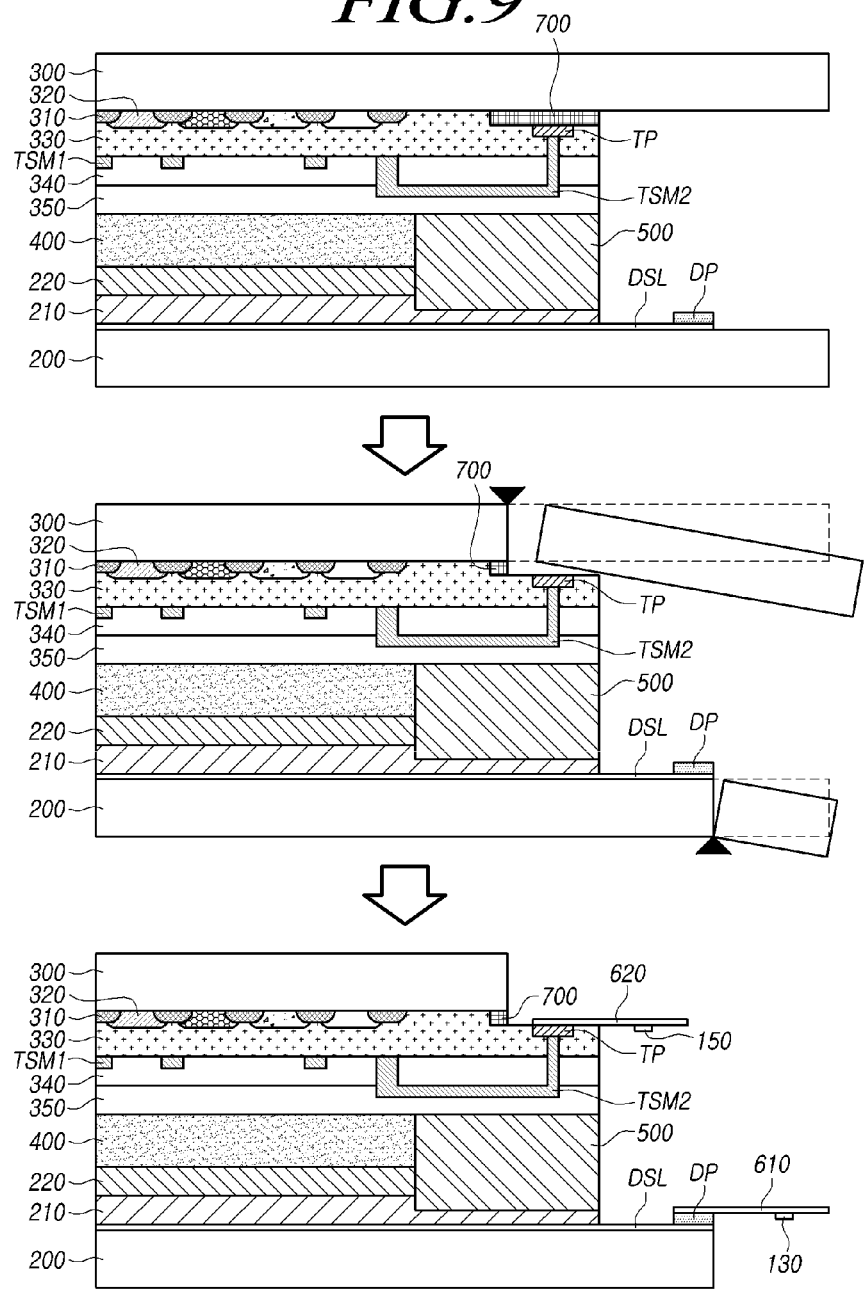
FIG. 9 is a view illustrating an example process for a touch display device as illustrated in FIG. 8, according to an embodiment.

FIG. 8 is a view illustrating another example arrangement of display pads DP and touch pads TP in a touch display device 100 according to an embodiment. FIG. 9 is a view illustrating an example process for a touch display device 100 as illustrated in FIG. 8, according to an embodiment.

Referring to FIG. 8, the thin film transistor layer 210 and the light emitting element layer 220 may be disposed on the first substrate 200.

The filling layer 400 and the dam 500 may be positioned on the first substrate 200.

A plurality of display pads DP may be disposed outside the dam 500 in the non-active area NA of the first substrate 200. The display pads DP may electrically connect the display signal lines DSL and the data driving circuit 130.

The color filter and the touch sensing layer TSL may be disposed on one surface of the second substrate 300.

FIG. 8 illustrates an example in which the color filter and the touch sensing layer TSL are disposed on the lower surface of the second substrate 300. Although FIG. 8 illustrates an example in which the touch sensing layer TSL is formed of two layers including a first touch sensor metal TSM1 and a second touch sensor metal TSM2, embodiments of the disclosure are not limited thereto.

A black matrix 310 and a color filter layer 320 may be disposed on the lower surface of the second substrate 300. An overcoat layer 330 may be disposed on the black matrix 310 and the color filter layer 320.

The first touch sensor metal TSM1 may be disposed on the overcoat layer 330. The first touch sensor metal TSM1 positioned in the active area AA may be disposed in an area overlapping the black matrix 310. Accordingly, the touch sensing layer TSL may be implemented without affecting image display.

A first protective layer 340 may be disposed on the first touch sensor metal TSM1.

The second touch sensor metal TSM2 may be disposed on the first protective layer 340. The second touch sensor metal TSM2 positioned in the active area AA may be disposed in an area overlapping the black matrix 310.

The first touch sensor metal TSM1 and the second touch sensor metal TSM2 may be electrically connected with each other through a contact hole formed in the first protective layer 340.

The first touch sensor metal TSM1 and the second touch sensor metal TSM2 may be a part of the touch electrode TE or a part of the touch line TL. Further, the touch pad TP may be disposed using the first touch sensor metal TSM1 and the second touch sensor metal TSM2.

The touch pad TP may be located on the dam 500. The touch pad TP may be positioned on the overcoat layer 330 protruding outward of the second substrate 300. The touch pad TP may be located in an area where the second substrate 300 is not disposed.

When a portion of the overcoat layer 330, which is positioned in the area overlapping the second substrate 300 in the overcoat layer 330 disposed on the lower surface of the second substrate 300, is a "first portion," and a portion of the overcoat layer 330, which protrudes outward of the second substrate 300, is a "second portion," the touch pad TP may be positioned in the recessed area of the second portion of the overcoat layer 330. The recessed area may be an area in which the upper surface thereof is lower than that of other area in the second portion of the overcoat layer 330, and may have a flat upper surface. For example, the touch pad TP may be filled in the recessed area Since the touch pad TP is positioned on the overcoat layer 330, and the second substrate 300 is not positioned on the touch pad TP, the touch pad TP may be exposed to the outside.

Further, since the touch pad TP is located on the dam 500 in an area between the active area AA and the display pad DP, the touch pad TP may be located in an area that does not overlap the display pad DP.

Accordingly, even when the touch pad TP is located on the side portion of the display panel 110 on which the display pad DP is disposed among the side portions of the display panel 110, bonding between the touch pad TP and the second printed circuit 620 on which the touch driving circuit 150 is mounted may easily be performed.

The arrangement of the touch pads TP illustrated in FIG. 8 may be formed by a process of removing a portion of the second substrate 300 after attaching the first substrate 200 and the second substrate 300.

Referring to FIGS. 8 and 9, the first substrate 200 and the second substrate 300 are attached together, and a laser lift off (LLO) process may be performed on a portion of the second substrate 300. The area where the LLO process is performed may be an area including an area overlapping the touch pad TP.

Accordingly, a sacrificial layer 700 may be disposed in the area including the area overlapping the touch pad TP on the lower surface of the second substrate 300.

After the LLO process, a process of cutting the second substrate 300 may be performed.

By the above-described process, the sacrificial layer 700 may be removed from the touch pad TP. The second substrate 300 may be removed from the touch pad TP. Accordingly, the touch pad TP may be positioned in the recessed area of the overcoat layer 330 and exposed to the outside.

The sacrificial layer 700 may be disposed considering a process margin. Accordingly, after the LLO process and the process of cutting the second substrate 300, the sacrificial layer 700 may remain in a partial area of the lower surface of the second substrate 300.

The sacrificial layer 700 positioned in the partial area of the lower surface of the second substrate 300 may be exposed to the outside.

With the sacrificial layer 700 disposed on the lower surface of the second substrate 300, the overcoat layer 330 may be formed. Thereafter, the sacrificial layer 700 may be removed.

Therefore, the thickness of the overcoat layer 330 positioned in the area overlapping the area where the sacrificial layer 700 is disposed may be smaller than the thickness of the overcoat layer 330 positioned in the area overlapping the second substrate 300.

Further, the touch pad TP positioned on the overcoat layer 330 may be positioned lower than the lower surface of the second substrate 300.

As such, by the process of removing a portion of the second substrate 300 after attaching the first substrate 200 and the second substrate 300 to each other, it is possible to implement an easier connection structure of the touch pad TP while forming the touch sensing layer TSL on the lower surface of the second substrate 300.

Further, since the touch pad TP exposed by the LLO process needs to be supported by the lower structure, the touch pad TP may be located on the dam 500.

Since a portion of the second substrate 300 is removed, with the first substrate 200 and the second substrate 300 attached together to allow the touch pad TP to be positioned on the dam 500, the touch pad TP may be exposed to the outside after the LLO process, and the bonding process may be stably performed.

Further, the efficiency of the LLO process on the area where the touch pad TP is disposed may be increased by placing a separate dam 500, other than the dam 500 for sealing, under the touch pad TP considering the characteristics of the LLO process.

Figure 10:
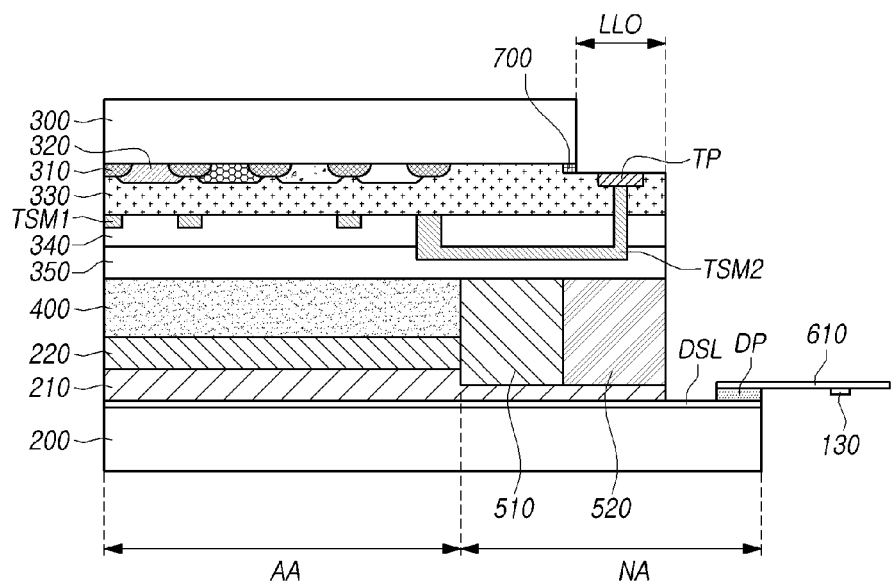
FIG. 10 is a view illustrating another example arrangement of display pads and touch pads in a touch display device according to an embodiment.

FIG. 10 is a view illustrating another example arrangement of display pads DP and touch pads TP in a touch display device 100 according to an embodiment.

Referring to FIG. 10, the thin film transistor layer 210 and the light emitting element layer 220 may be disposed on the first substrate 200.

The black matrix 310, the color filter layer 320, the overcoat layer 330, the first touch sensor metal TSM1, the first protective layer 340, the second touch sensor metal TSM2, and the second protective layer 350 may be disposed on the second substrate 300.

The filling layer 400 may be disposed in an area including the active area AA between the first substrate 200 and the second substrate 300.

A first dam 510 may be disposed between the first substrate 200 and the second substrate 300 to surround the outer surface of the filling layer 400. A second dam 520 may be positioned outside the first dam 510 between the first substrate 200 and the second substrate 300.

The first dam 510 may be a dam 500 disposed, e.g., for preventing moisture permeation.

The second dam 520 may be a dam 500 disposed, e.g., for increasing the efficiency of the LLO process partially performed on the second substrate 300 on the touch pad TP.

Accordingly, the second dam 520 may be formed of a material having superior heat resistance, rigidity, and adhesion compared to the first dam 510 located inside the second dam 520. Further, the second dam 520 may be a material that has a constant transmittance to enable a process, is curable, and capable of width management for the line that may be disposed by a dispensing process.

The second dam 520 may be disposed to contact the outer surface of the first dam 510. In some cases, by the nature of the process, at least a portion of the second dam 520 may be spaced apart from the outer surface of the first dam 510. Accordingly, a space may exist between the first dam 510 and the second dam 520.

The touch pad TP may be located on the second dam 520. The second dam 520 may be disposed in an area wider than the area in which the touch pad TP is disposed. The width of the second dam 520 may be larger than the length of the touch pad TP.

An LLO process may be performed within the area overlapping the second dam 520.

The area where a portion of the second substrate 300 is removed may be narrower than the area overlapping the second dam 520. Accordingly, an outer periphery of the second substrate 300 adjacent to the touch pad TP may be positioned on the area overlapping the second dam 520.

As the second dam 520 having superior heat resistance is disposed outside the first dam 510, and an LLO process is performed on the second dam 520, it is possible to implement an arrangement structure for the touch pad TP while increasing the efficiency and stability of the LLO process.

Further, the process of forming the touch pad TP on the lower surface of the second substrate 300 may be performed in various ways.

FIGS. 11 to 14 are views illustrating various example structures of a touch substrate included in a touch display device 100 as illustrated in FIG. 10.

Figure 11:
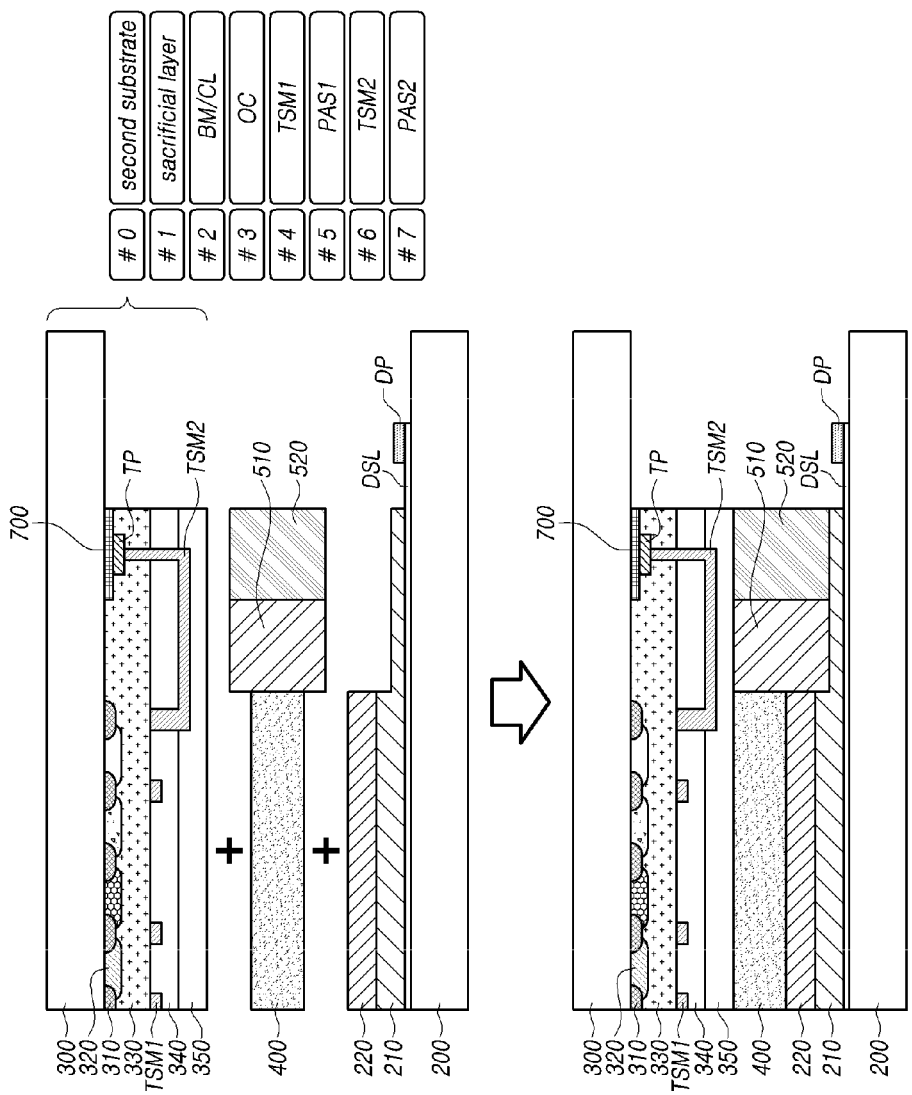
FIGS. 11, 12, 13, and 14 are views illustrating various example structures of a touch substrate included in a touch display device as illustrated in FIG. 10.

For example, referring to FIG. 11, as in the example illustrated in FIG. 10, the color filter layer 320 is disposed on the lower surface of the second substrate 300, and the touch sensing layer TSL may then be formed.

In this case, the process for the second substrate 300 may be performed in such a manner as to sequentially arrange the second substrate 300, the sacrificial layer 700, the black matrix (BM) 310, the color filter layer (CL) 320, the overcoat layer (OC) 330, the first touch sensor metal TSM1, the first protective layer (PAS1) 340, the second touch sensor metal TSM2, and the second protective layer (PAS2) 350.

The touch pad TP may be disposed by disposing the overcoat layer 330, forming a contact hole in the overcoat layer 330, and disposing the first touch sensor metal TSM1.

Alternatively, the touch pad TP may be disposed by forming a contact hole in the first protective layer 340 after disposing the first protective layer 340, and disposing the second touch sensor metal TSM2.

Figure 12:
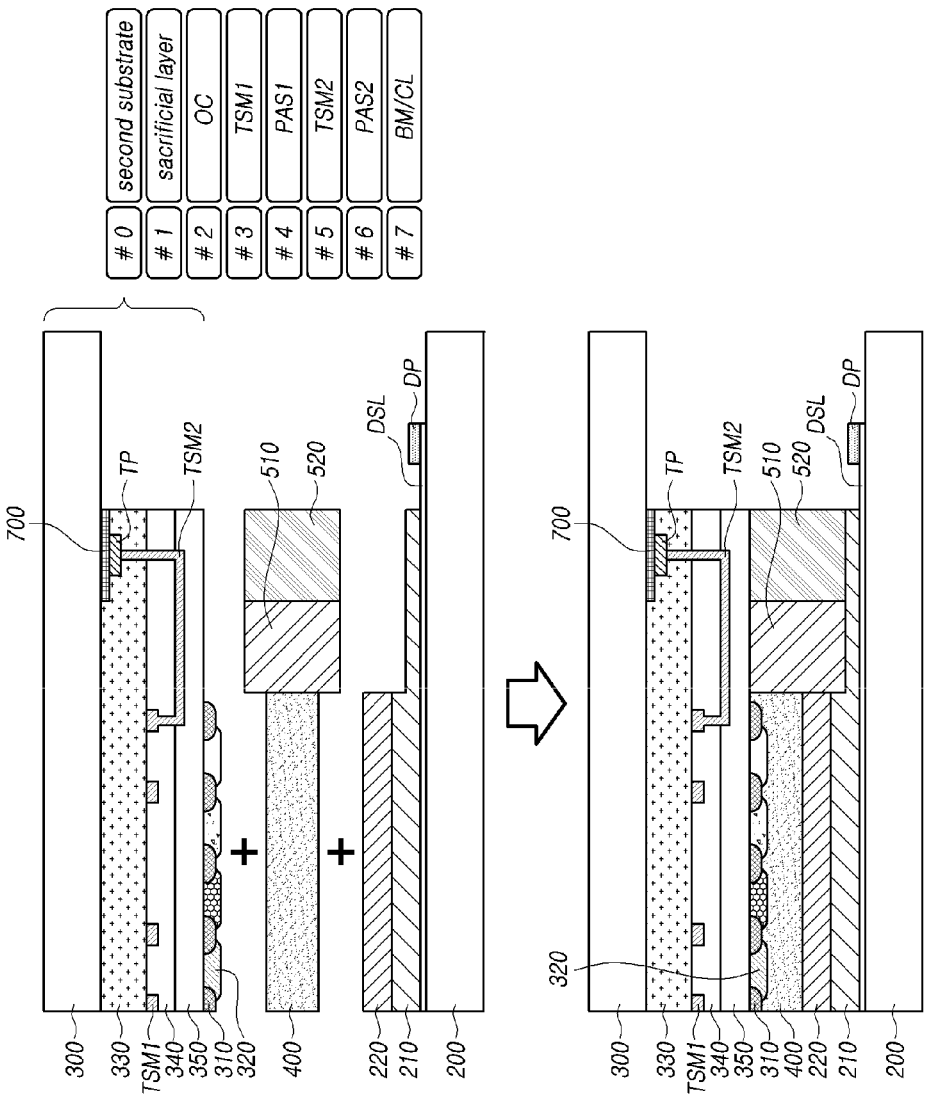

As another example, referring to FIG. 12, the touch sensing layer TSL may be disposed on the lower surface of the second substrate 300, and the color filter layer 320 may then be formed.

In this case, the process for the second substrate 300 may be performed in such a manner as to sequentially arrange the second substrate 300, the sacrificial layer 700, the overcoat layer (OC) 330, the first touch sensor metal TSM1, the first protective layer (PAS1) 340, the second touch sensor metal TSM2, the second protective layer (PAS2) 350, the black matrix (BM) 310, and the color filter layer (CL) 320.

The touch pad TP may be disposed in a similar manner to the method described above with reference to FIG. 11.

Figure 13:
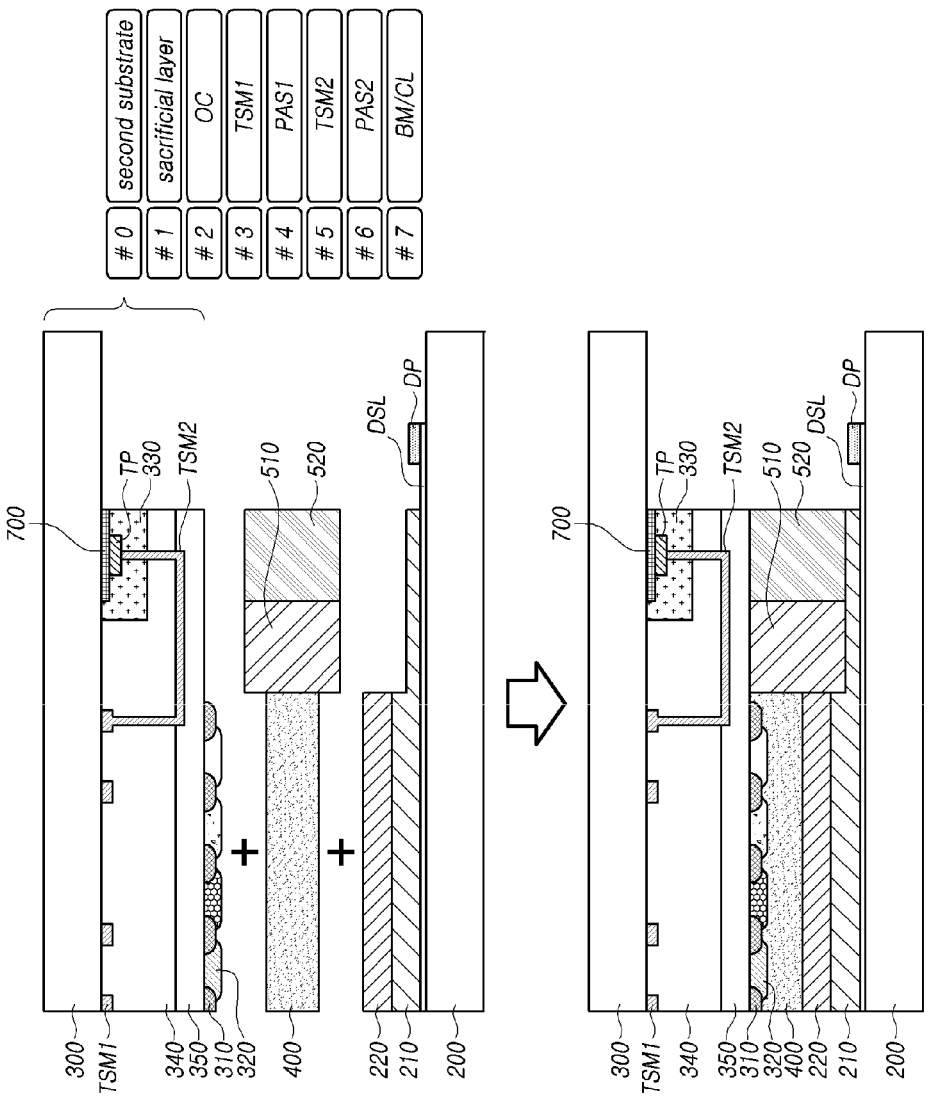

As another example, referring to FIG. 13, in the structure in which the touch sensing layer TSL is first disposed on the lower surface of the second substrate 300, the overcoat layer 330 may be disposed locally.

As in the example illustrated in FIG. 13, the sacrificial layer 700 is disposed on the lower surface of the second substrate 700, and the overcoat layer 330 may be disposed only in a partial area including the area where the touch pad TP is formed.

In this case, the process for the second substrate 300 and the method for arranging the touch pad TP may be performed similarly to the method described above with reference to FIG. 12.

Figure 14:
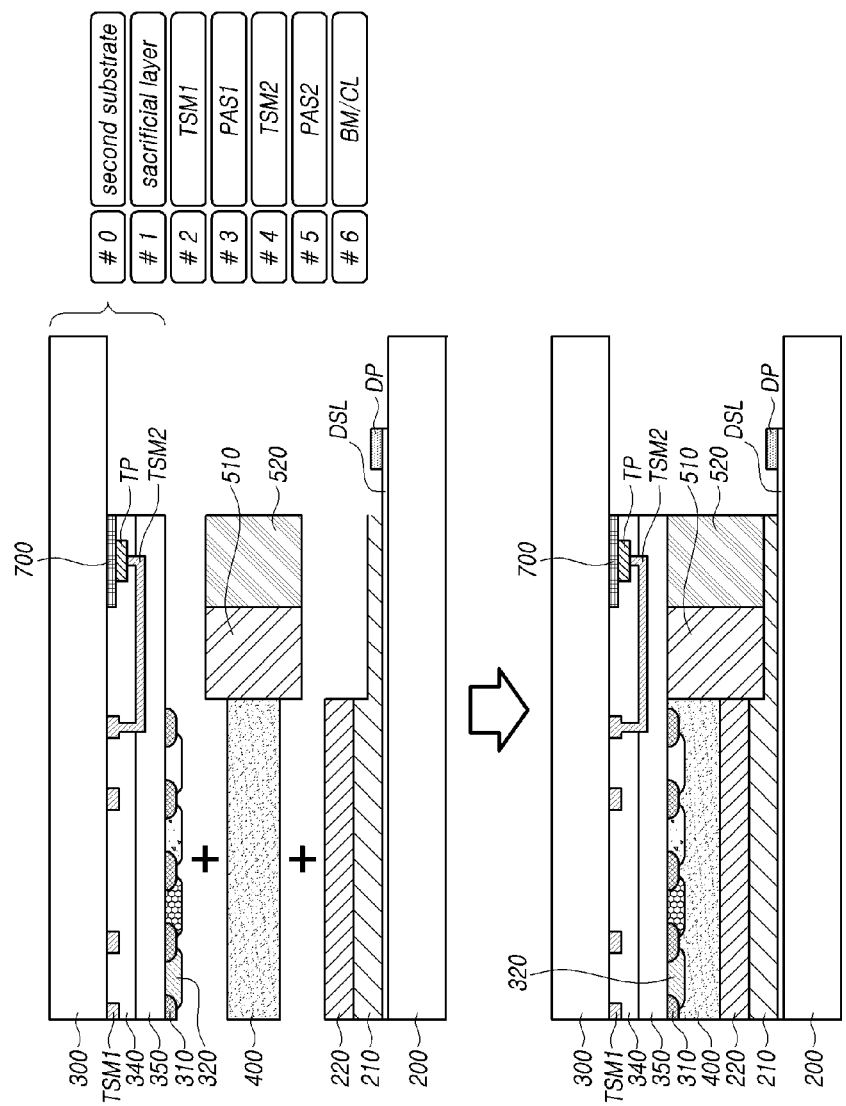

As another example, referring to FIG. 14, the overcoat layer 330 may not be disposed on the lower surface of the second substrate 300.

In this case, the process for the second substrate 300 may be performed in such a manner as to sequentially arrange the second substrate 300, the sacrificial layer 700, the first touch sensor metal TSM1, the first protective layer (PAS1) 340, the second touch sensor metal TSM2, the second protective layer (PAS2) 350, the black matrix (BM) 310, and the color filter layer (CL) 320.

The touch pad TP may be formed in the process of disposing the first touch sensor metal TSM1 on the second substrate 300. Alternatively, the touch pad TP may be formed in the process of forming a contact hole in the first protective layer 340 and disposing the second touch sensor metal TSM2 after the first protective layer 340 is disposed.

The touch pad TP may be positioned on a portion of the insulating layer disposed on the lower surface of the second substrate 300, in which the first protective layer 340 protrudes outward from the second substrate 300.

As in the above-described example, the process of forming the sacrificial layer 700 and the touch pad TP on the lower surface of the second substrate 300 may be performed in various ways. The method described above in connection with FIGS. 11 to 14 may be applied even where one dam 500 is disposed, as in the example illustrated in FIG. 8.

After attaching the second substrate 300 on which the touch pad TP is formed to the first substrate 200, a partial LLO process may be performed on the second substrate 300 to expose the touch pad TP to the outside.

Figure 15A:
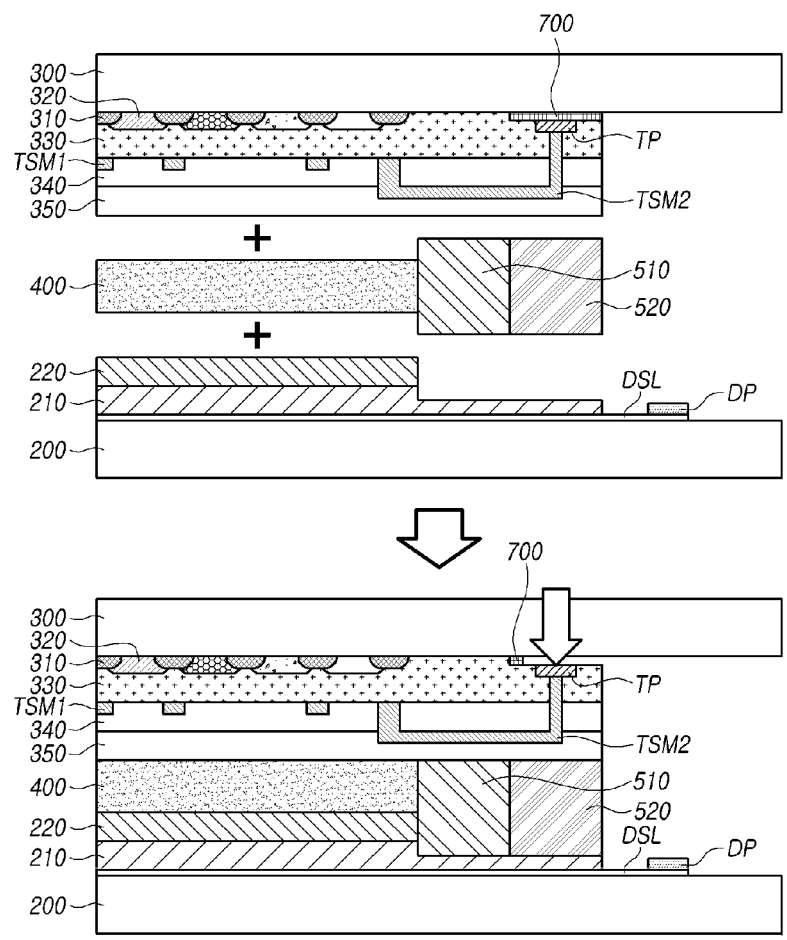
FIGS. 15A and 15B are views illustrating an example process for a touch display device as illustrated in FIGS. 10.
Figure 15B:
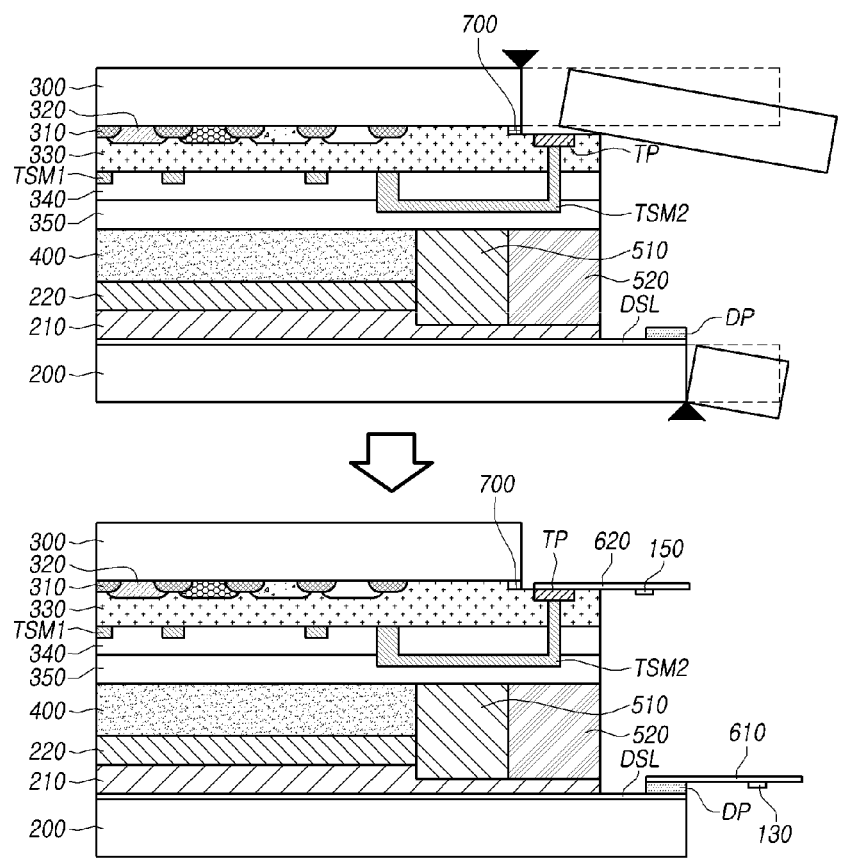

FIGS. 15A and 15B are views illustrating an example process for a touch display device 100 as illustrated in FIG. 10.

Referring to FIG. 15A, the filling layer 400, the first dam 510, and the second dam 520 are disposed on the first substrate 200 on which the display pad DP is formed. The second substrate 300 on which the touch pad TP is formed is attached with the first substrate 200.

After the first substrate 200 and the second substrate 300 are attached together, an LLO process is performed on a partial area of the second substrate 300. A portion of the sacrificial layer 700 positioned on the touch pad TP may be removed by the LLO process.

Referring to FIG. 15B, after the LLO process is performed, a process of cutting the first substrate 200 and the second substrate 300 may be performed.

Where the first substrate 200 is cut may be located outside the area where the display pad DP is positioned on the first substrate 200. Where the second substrate 300 is cut may be located inside the area where the touch pad TP is positioned on the second substrate 300.

As the second substrate 300 is cut, the second substrate 300 located in the area where the LLO process has been performed may be removed.

Accordingly, the touch pad TP positioned in the area from which the sacrificial layer 700 has been removed from the lower surface of the second substrate 300 may be exposed to the outside.

Since a portion of the second substrate 300 is removed, the second substrate 300 may not be disposed in the area overlapping the display pad DP disposed on the first substrate 200.

Since the second substrate 300 is not positioned on the display pad DP, bonding between the display pad DP and the first printed circuit 610 on which the data driving circuit 130 is mounted may be easily performed.

Since the touch pad TP is positioned on the second dam 520, the touch pad TP may be positioned further inside than the display pad DP positioned on the first substrate 200. Accordingly, the touch pad TP may be located in an area that does not overlap the area in which the display pad DP is disposed. The touch pad TP may be positioned higher than the display pad DP.

Since the touch pad TP is disposed higher than the display pad DP in the area that does not overlap the display pad DP and is exposed to the outside, bonding between the touch pad TP and the second printed circuit 620 on which the touch driving circuit 150 is mounted may be easily performed.

Accordingly, according to an embodiment, there may be provided a structure in which the display pad DP and the touch pad TP are disposed on the same side portion among the side portions of the display panel 110, and bonding between the pad and the printed circuit on which the driving circuit is mounted may easily be performed.

The display pad DP and the touch pad TP may be disposed on the same side portion among the side portions of the display panel 110, and may be disposed in various structures according to types.

FIGS. 16 to 24 are views illustrating an example connection structure between a driving circuit and a plurality of pads arranged in a touch display device 100 according to an embodiment.

Referring to FIG. 16, (a) of FIG. 16 illustrates a plan view of an area in which the display pad DP and the touch pad TP are disposed in the non-active area NA of the display panel 110. (b) of FIG. 16 illustrates a cross-sectional view of the structure of FIG. 16(a) as viewed from the side.

The display pad DP may be disposed outside the dam 500 on the first substrate 200.

The touch pad TP may be located on the dam 500. The touch pad TP may be positioned in the part where any one of insulation layers, such as the overcoat layer 330, the first protective layer 340, and the second protective layer 350 disposed on the lower surface of the second substrate 300 protrudes outward of the second substrate 300.

The second substrate 300 may be located in an area except for the area where the display pad DP and the touch pad TP are disposed. Accordingly, the display pad DP and the touch pad TP may be disposed to facilitate the bonding process.

The display pad DP and the touch pad TP may be alternately disposed.

The first printed circuit 610 on which the data driving circuit 130 is mounted may be electrically connected with the display pad DP on the first substrate 300 and the bonding pad BP of the source printed circuit board 800.

The second printed circuit 620 on which the touch driving circuit 150 is mounted may be electrically connected with the touch pad TP on the dam 500 and the bonding pad BP of the source printed circuit board 800.

The above-described structure may be formed by the process of simultaneously bonding the first printed circuit 610 and the second printed circuit 620 to the bonding pad BP of the source printed circuit board 800 after the bonding process between the display pad DP and the first printed circuit 610 and the bonding process between the touch pad TP and the second printed circuit 620 are performed.

Since the display pad DP and the touch pad TP are positioned at different heights in the area where the display pad DP and the touch pad TP do not overlap each other, bonding between the pad and the printed circuit may be easily performed.

Further, since the touch pad TP is positioned between the display pad DP and the active area AA, the number of touch pads TP disposed on the display panel 110 may increase. Accordingly, it is possible to easily implement a large-area touch display device 100.

Figure 17:
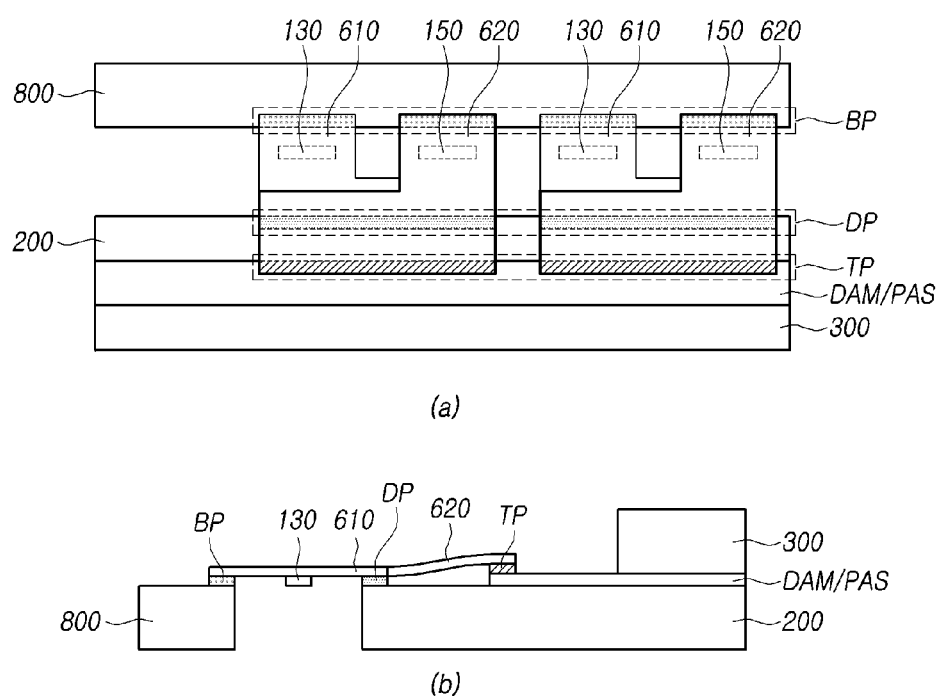

Referring to FIG. 17, the touch pad TP may be disposed between the display pad DP and the active area AA.

Since the touch pad TP is located on the dam 500 and does not impair the bonding process efficiency of the display pad DP, the touch pad TP may be overall disposed between the display pad DP and the active area AA.

Accordingly, the number of display pads DP and the number of touch pads TP disposed on the display panel 110 may increase.

In this case, the first printed circuit 610 and the second printed circuit 620 may be formed in an asymmetric shape.

As an example, the width of the portion where the first printed circuit 610 is connected with the bonding pad BP may be smaller than the width of the portion where the first printed circuit 610 is connected with the display pad DP. The width of the portion where the second printed circuit 620 is connected with the bonding pad BP may be smaller than the width of the portion where the second printed circuit 620 is connected with the touch pad TP.

A portion of the first printed circuit 610 and a portion of the second printed circuit 620 may overlap each other.

Since the number of wires connecting the driving circuit and the bonding pads BP of the source printed circuit board 800 may be smaller than the number of wires connecting the driving circuit and the pads disposed on the display panel 110, the printed circuit may be arranged in an asymmetric structure as illustrated in FIG. 17.

Further, since the number of display pads DP and the number of touch pads TP disposed on the display panel 110 increase, it is possible to easily implement a large-area, high-resolution touch display device 100.

Further, in some cases, one of the first printed circuit 610 and the second printed circuit 620 may completely overlap the other printed circuit.

Figure 18:
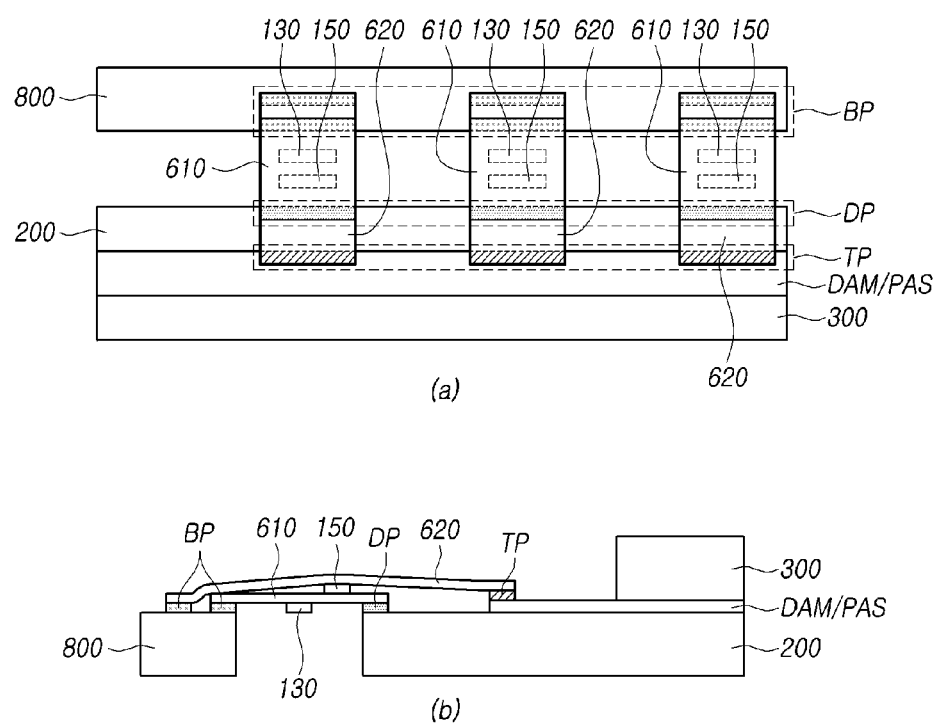

Referring to FIG. 18, the touch pad TP may be disposed between the display pad DP and the active area AA.

The first printed circuit 610 on which the data driving circuit 130 is mounted may be connected with the display pad DP disposed on the first substrate 200 and may be connected with the bonding pad BP disposed on the source printed circuit board 800.

The second printed circuit 620 on which the touch driving circuit 150 is mounted may be connected with the touch pad TP positioned on the dam 500 and may be connected with the bonding pad BP disposed on the source printed circuit board 800.

The second printed circuit 620 may be disposed to completely overlap the first printed circuit 610.

Accordingly, the number of printed circuits that may be disposed on the side of the display panel 110 may increase.

The data driving circuit 130 and the touch driving circuit 150 may be mounted on the same printed circuit. One printed circuit on which the data driving circuit 130 and the touch driving circuit 150 are mounted may be electrically connected with the display pad PD and the touch pad TP.

Referring to FIG. 19, the display pad DP may be disposed on the first substrate 200. The touch pad TP may be located on the dam 500. The display pad DP and the touch pad TP may be alternately disposed along the periphery of the active area AA.

The data driving circuit 130 and the touch driving circuit 160 may be mounted on an integrated printed circuit 630.

The integrated printed circuit 630 may be electrically connected with the display pad DP. The integrated printed circuit 630 may be electrically connected with the touch pad TP. The integrated printed circuit 630 may be electrically connected with the bonding pad BP disposed on the source printed circuit board 800.

Since the data driving circuit 130 and the touch driving circuit 160 are mounted on one integrated printed circuit 630, the number of processes for bonding the driving circuit-mounted printed circuit to the display panel 110 may be reduced. Accordingly, it is possible to more easily form an electrical connection between the driving circuit-mounted printed circuit and the pad disposed on the display panel 110.

Further, since the data driving circuit 130 and the touch driving circuit 150 are disposed on the integrated printed circuit 630, it may be easy to implement the data driving circuit 130 and the touch driving circuit 150 in an integrated form.

FIG. 20 illustrates an example structure in which the integrated driving circuit 160 in which the data driving circuit 130 and the touch driving circuit 150 are integrated is mounted on the integrated printed circuit 630.

The integrated printed circuit 630 on which the integrated driving circuit 160 is mounted may be electrically connected with the display pad DP and the touch pad TP disposed on the display panel 110. The integrated printed circuit 630 may be electrically connected with the bonding pad BP disposed on the source printed circuit board 800.

Since the display pad DP and the touch pad TP are electrically connected with a single integrated printed circuit 630, it is possible to easily form an electrical connection between the driving circuit and the pad even when the data driving circuit 130 and the touch driving circuit 150 are integrated into the integrated driving circuit 160.

Further, according to an embodiment, it is possible to increase the number of pads connected with the integrated driving circuit 630 by adjusting the structure in which wires are disposed on the integrated driving circuit 630 or implementing the integrated driving circuit 630 of a plurality of layers.

Referring to FIG. 21, the display pad DP may be disposed on the first substrate 200. The touch pad TP may be disposed on the dam 500. The touch pad TP may be disposed between the display pad DP and the active area AA.

Since the touch pad TP is disposed between the display pad DP and the active area AA, the number of touch pads TP disposed on the display panel 110 may increase. The number of display pads DP disposed on the display panel 110 may increase as well.

In this case, the wire connecting the touch driving circuit 150 and the touch pad TP may be disposed while avoiding the display pad DP in the integrated printed circuit 630.

Alternatively, the integrated printed circuit 630 may include a plurality of layers. The layer on which the wire electrically connecting the data driving circuit 130 and the display pad DP is disposed and the layer on which the wire electrically connecting the touch driving circuit 150 and the touch pad TP is disposed may differ from each other.

As such, as the number of display pads DP and the number of touch pads TP disposed on the display panel 110 increase, it is possible to easily implement a large-area, high-resolution touch display device 100.

The width of the integrated printed circuit 630 may be reduced by adjusting the position where the data driving circuit 130 and the touch driving circuit 150 are mounted on the integrated printed circuit 630.

Referring to FIG. 22, the data driving circuit 130 and the touch driving circuit 150 may be mounted on the integrated printed circuit 630. The data driving circuit 130 and the touch driving circuit 150 may be aligned and arranged along a direction crossing the outer periphery of the display panel 110.

Since the data driving circuit 130 and the touch driving circuit 150 are aligned and arranged, the width of the integrated printed circuit 630 may be reduced.

Although FIG. 22 illustrates an example in which the data driving circuit 130 is located adjacent to the display panel 110, the touch driving circuit 150, in some cases, may be located adjacent to the display panel 110.

If a large number of pads are not required, the area where the integrated printed circuit 630 is disposed may be reduced by arranging the data driving circuit 130 and the touch driving circuit 150 on the line crossing the outer periphery of the display panel 110.

In this case, as illustrated in FIG. 23, the integrated driving circuit 160 in which the data driving circuit 130 and the touch driving circuit 150 are integrated may be mounted on the integrated printed circuit 630.

The bonding pads BP connected with the integrated printed circuit 630 may be disposed on a plurality of lines, as are the display pads DP and the touch pads TP but, in some cases, may be disposed on a single line.

Referring to FIG. 24, the integrated printed circuit 630 may be electrically connected with the display pad DP and the touch pad TP. The integrated printed circuit 630 may be electrically connected with the bonding pad BP disposed on the source printed circuit board 800.

The bonding pads BP may be disposed on a single line on the source printed circuit board 800.

The signal supplied from the source printed circuit board 800 to the integrated driving circuit 160 mounted on the integrated printed circuit 630 is a digital signal, and the number of wires for signal transmission may not be large. Accordingly, the process of bonding the integrated printed circuit 630 to the source printed circuit board 800 may be facilitated by disposing the bonding pads BP disposed on the source printed circuit board 800 on a single line.

The structure in which the bonding pads BP are disposed on a single line may also be applied to the structure illustrated in FIG. 21.

As described above, since the touch pad TP is positioned at a different height from the display pad DP in the area that does not overlap the display pad DP, the printed circuit bonded to the pad may have various arrangement structures.

According to the embodiments set forth above, it is possible to prevent an increase in the non-active area NA of the display panel 110 and allow for easier arrangement of various pads by providing a structure in which the display pad DP and the touch pad TP may be arranged on the same side portion among the side portions of the display panel 110.

According to the embodiments, a structure in which the touch pad TP is exposed to the outside may be formed by the process of removing a portion of the second substrate 300 on which the touch sensing layer TSL is formed.

Accordingly, it is possible to provide a structure in which the touch pad TP is positioned in an area that does not overlap the area in which the display pad DP is disposed and is positioned higher than the display pad DP.

This structure facilitates bonding between the pad and the printed circuit on which the driving circuit is mounted and increases the number of pads that may be disposed on the display panel 110, thereby making it possible to easily implement a large-area or high-resolution touch display device 100.

It will be apparent to those skilled in the art that various modifications and variations can be made in the touch display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A touch display device, comprising:
    a first substrate including an active area and a non-active area positioned outside the active area;
    a plurality of first pads arranged in the non-active area on the first substrate;
    at least one dam positioned between the plurality of first pads and the active area on the first substrate;
    a second substrate positioned on the at least one dam and the first substrate and positioned in an area except for at least a partial area of an area overlapping the at least one dam, a plurality of touch electrodes disposed on a surface of the second substrate; and
    a plurality of second pads positioned on the at least one dam and electrically connected with at least one touch electrode among the plurality of touch electrodes.

2. The touch display device of claim 1, wherein the plurality of second pads are positioned in an area except for an area overlapping the second substrate.

3. The touch display device of claim 1, wherein an upper surface of the plurality of second pads is positioned lower than a lower surface of the second substrate.

4. The touch display device of claim 1, wherein the at least one dam includes:
    a first dam positioned outside the active area; and
    a second dam positioned outside the first dam and disposed under the plurality of second pads.

5. The touch display device of claim 4, wherein a width of the second dam is larger than a length of each of the plurality of second pads.

6. The touch display device of claim 4, wherein an outer periphery of the second substrate, which is positioned adjacent to the plurality of second pads, is positioned in an area overlapping the second dam.

7. The touch display device of claim 4, wherein at least a portion of the second dam is spaced apart from the first dam.

8. The touch display device of claim 1, further comprising a filling layer disposed between the first substrate and the second substrate, wherein the at least one dam is disposed to surround the filling layer.

9. The touch display device of claim 1, further comprising a sacrificial layer disposed in a partial area on a lower surface of the second substrate.

10. The touch display device of claim 9, wherein the sacrificial layer is positioned between the active area and the plurality of second pads.

11. The touch display device of claim 9, wherein a portion of the sacrificial layer is exposed to an outside.

12. The touch display device of claim 1, further comprising an insulating layer including:
    a first portion disposed in at least a partial area on a lower surface of the second substrate; and
    a second portion connected with the first portion, positioned outside the second substrate, and having a recessed area in which the plurality of second pads are positioned.

13. The touch display device of claim 12, wherein a thickness of the second portion is smaller than a thickness of at least a portion of the first portion.

14. The touch display device of claim 1, wherein the plurality of first pads and the plurality of second pads are alternately arranged along an outer periphery of the first substrate.

15. The touch display device of claim 1, wherein the plurality of second pads are positioned between the active area and the plurality of first pads.

16. The touch display device of claim 1, further comprising:
    at least one first printed circuit electrically connected with the plurality of first pads; and
    at least one second printed circuit electrically connected with the plurality of second pads and having a portion overlapping the first printed circuit.

17. A touch display device, comprising:

a first substrate including an active area and a non-active area positioned outside the active area;

a plurality of first pads arranged in the non-active area on the first substrate;

a plurality of second pads positioned between the plurality of first pads and the active area on the first substrate and positioned higher than the plurality of first pads; and a second substrate positioned in an area except for an area where the plurality of second pads are arranged on the first substrate and positioned higher than the plurality of second pads, a plurality of touch electrodes disposed on a surface of the second substrate.

18. A touch display device, comprising:

a display substrate including an active area and a non-active area positioned outside the active area;

a touch substrate positioned on the display substrate, a plurality of touch electrodes disposed on a surface of the touch substrate; and an insulating layer including a first portion disposed in at least a partial area of a lower surface of the touch substrate and a second portion connected with the first portion, positioned outside the touch substrate, and having a recessed area where a plurality of touch pads are positioned.

19. The touch display device of claim 18, wherein at least a portion of an outer periphery of the insulating layer is positioned between an outer periphery of the first substrate and an outer periphery of the second substrate.

20. The touch display device of claim 19, further comprising a plurality of display pads positioned between the outer periphery of the insulating layer and the outer periphery of the first substrate.

* * * * *